US010763145B2

(12) United States Patent
Tanaka

(10) Patent No.: US 10,763,145 B2
(45) Date of Patent: Sep. 1, 2020

(54) SEMICONDUCTOR MANUFACTURING EQUIPMENT AND SEMICONDUCTOR MANUFACTURING METHOD

(71) Applicant: Mitsubishi Electric Corporation, Tokyo (JP)

(72) Inventor: Hiroshi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/476,840

(22) PCT Filed: Mar. 10, 2017

(86) PCT No.: PCT/JP2017/009661
§ 371 (c)(1),
(2) Date: Jul. 9, 2019

(87) PCT Pub. No.: WO2018/163396
PCT Pub. Date: Sep. 13, 2018

(65) Prior Publication Data
US 2019/0385876 A1    Dec. 19, 2019

(51) Int. Cl.
*H01L 21/00* (2006.01)
*H01L 21/67* (2006.01)
(Continued)

(52) U.S. Cl.
CPC .... *H01L 21/67253* (2013.01); *H01L 21/3065* (2013.01); *H01L 21/30604* (2013.01); *H01L 21/67075* (2013.01); *H01L 22/26* (2013.01)

(58) Field of Classification Search
CPC ......... H01L 21/67253; H01L 21/30604; H01L 21/3065; H01L 21/67075; H01L 22/26
See application file for complete search history.

(56) References Cited

U.S. PATENT DOCUMENTS 5,077,464 A *  12/1991  Ebbing ................ B24B 37/013
                                                  250/201.4
5,131,752 A *   7/1992  Yu ...................... G01B 11/0683
                                                      216/60
(Continued)

FOREIGN PATENT DOCUMENTS

JP    S57-056933 A    4/1982
JP    2003-100702 A   4/2003
(Continued)

OTHER PUBLICATIONS

International Search Report issued in PCT/JP2017/009661; dated Jun. 6, 2017.
(Continued)

*Primary Examiner* — Richard A Booth
(74) *Attorney, Agent, or Firm* — Studebaker & Brackett PC

(57) ABSTRACT

A rotation mechanism is configured to rotate a wafer including an etched region which is to be etched at least partially. An etching mechanism etches the etched region. A thickness measurement function is configured to generate time-dependent thickness data by measuring a thickness of the etched region. An etching control function is configured to stop the etching mechanism when a representative value of thickness of the etched region reaches a target thickness value. A thickness calculation function is configured to calculate the representative value of thickness for each unit period in which the wafer is rotated N times, where N is a natural number, based on measurement values of the time-dependent thickness data in a measurement section being a range measured during the unit period.

9 Claims, 27 Drawing Sheets

(51) Int. Cl.
*H01L 21/306* (2006.01)
*H01L 21/3065* (2006.01)
*H01L 21/66* (2006.01)

(56) References Cited

U.S. PATENT DOCUMENTS

| | | | | |
|---|---|---|---|---|
| 5,308,447 A * | 5/1994 | Lewis | ............... | B24B 37/013 216/23 |
| 5,711,843 A * | 1/1998 | Jahns | ............... | B24B 37/013 156/345.24 |
| 6,228,277 B1 * | 5/2001 | Kornblit | ............ | G01B 11/0683 216/59 |
| 8,193,007 B1 * | 6/2012 | Madriaga | .......... | H01L 21/67253 438/14 |
| 2012/0067847 A1 | 3/2012 | Sakurai et al. | | |

FOREIGN PATENT DOCUMENTS

| | | |
|---|---|---|
| JP | 2012-069696 A | 4/2012 |
| JP | 2013-077843 A | 4/2013 |

OTHER PUBLICATIONS

An Office Action mailed by the Japanese Patent Office dated Mar. 17, 2020, which corresponds to Japanese Patent Application No. 2019-504260 and is related to U.S. Appl. No. 16/476,840.

* cited by examiner

F I G. 2
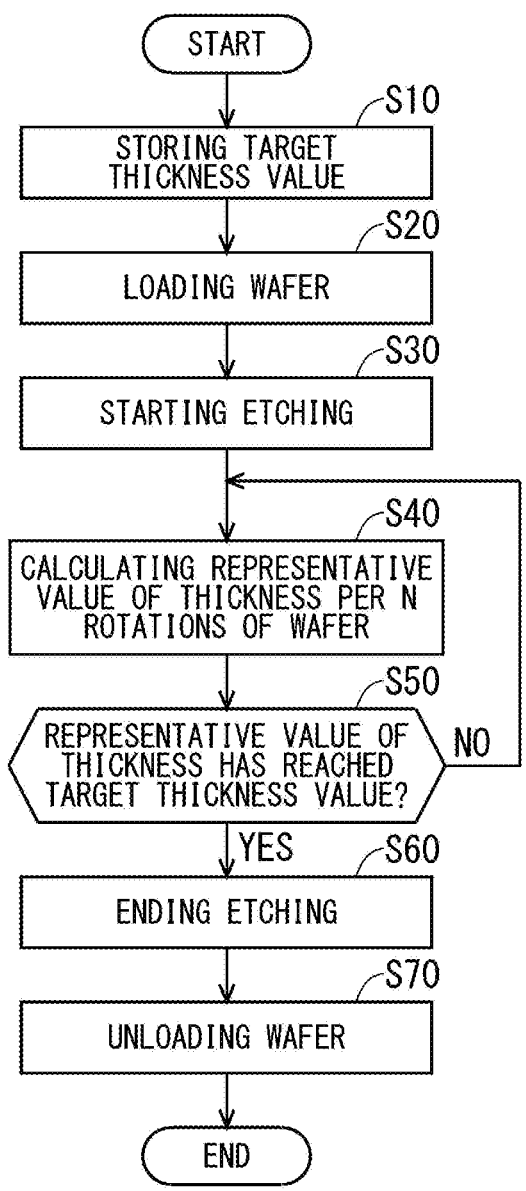

F I G . 5
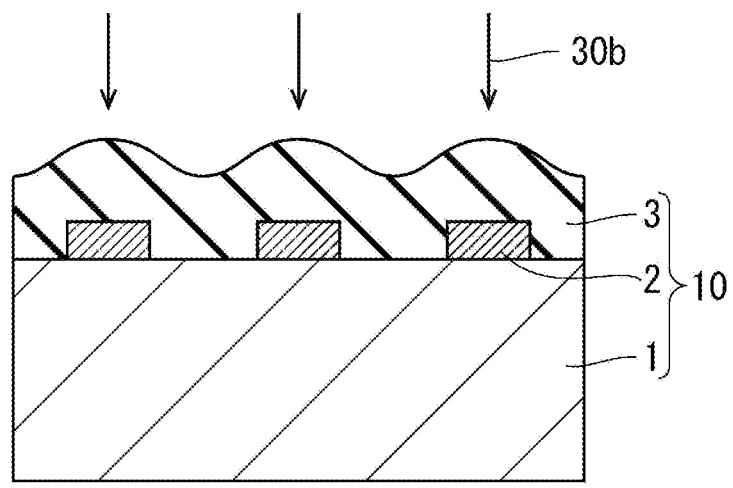
F I G . 6
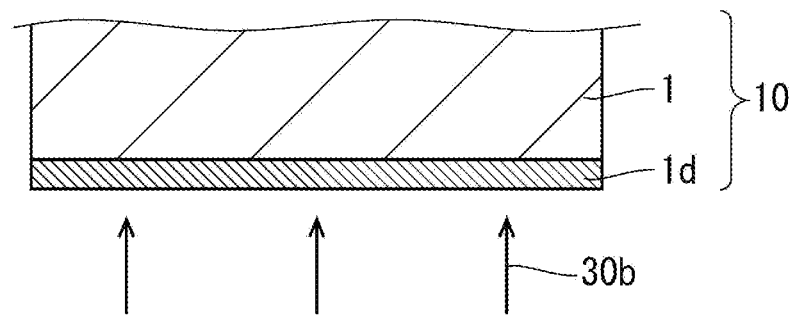

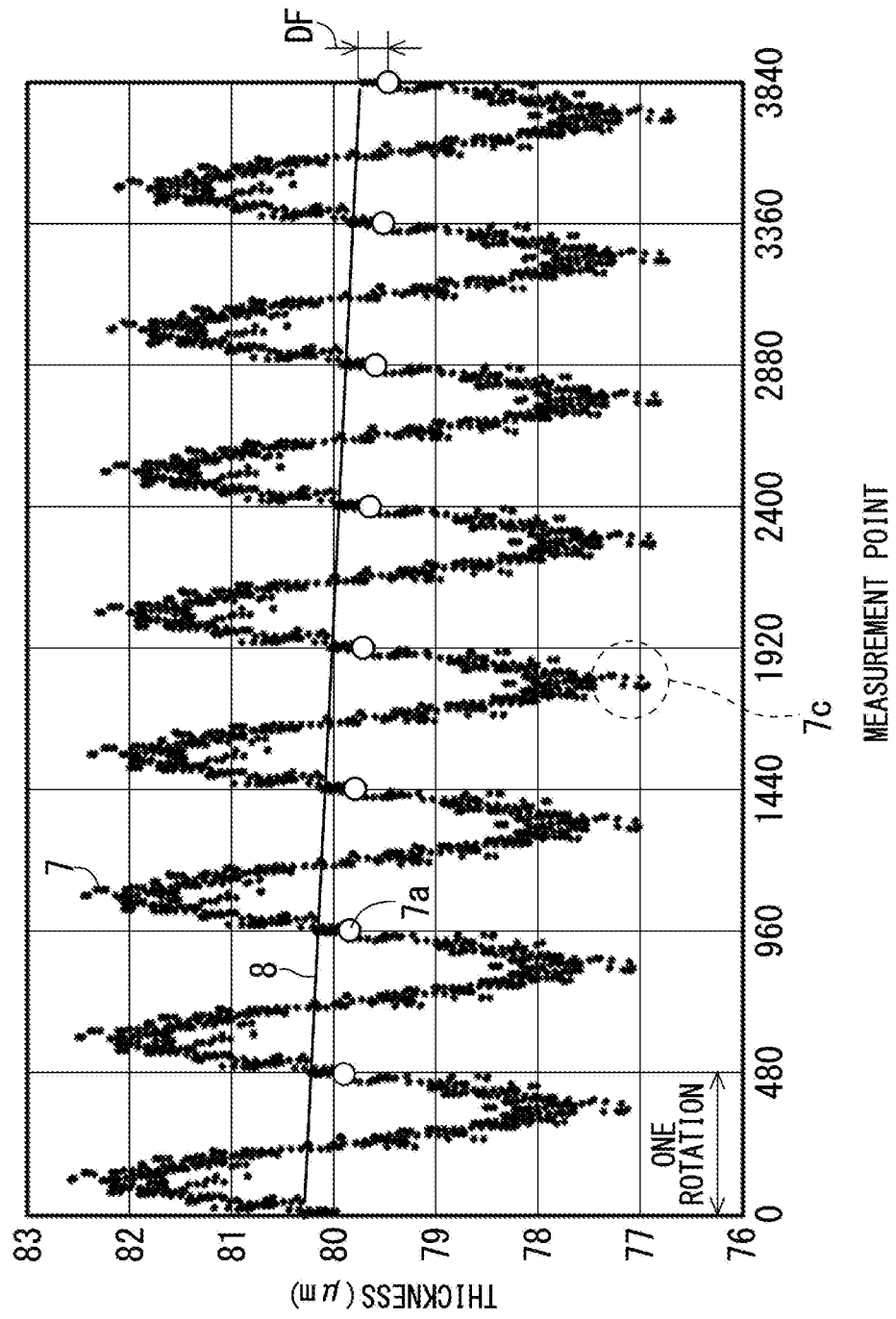

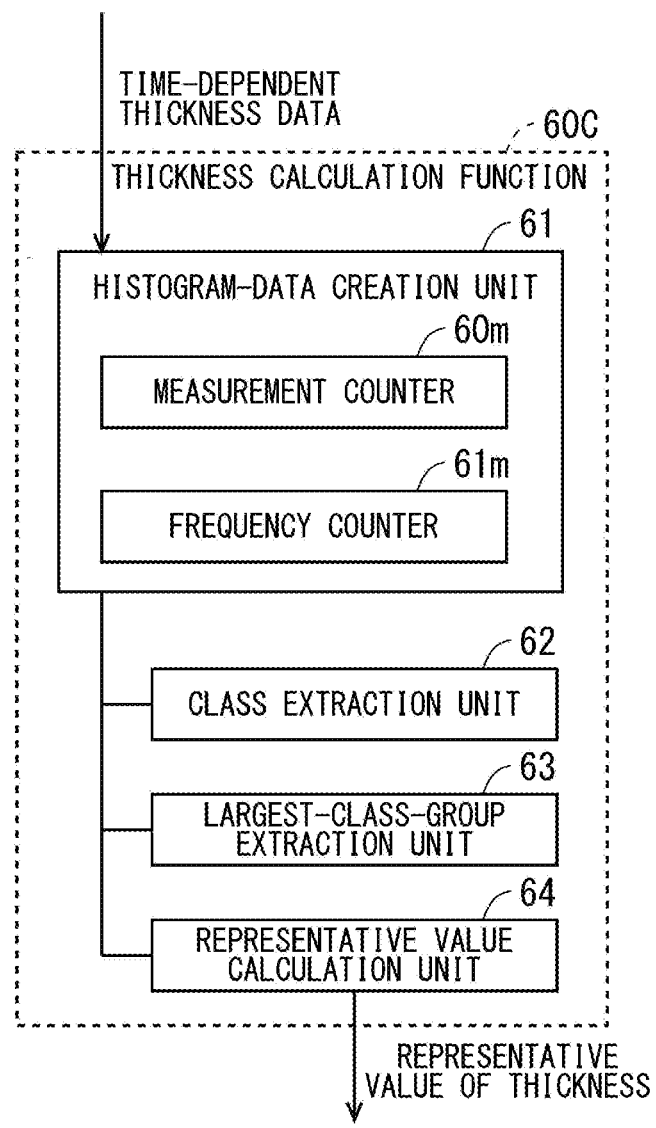
F I G . 1 1

FIG. 13

| UNIT PERIOD<br>MEASUREMENT SECTION<br>CLASS | 1<br>1 to 480 | 2<br>481 to 960 | 3<br>961 to 1440 | 4<br>1441 to 1920 | 5<br>1921 to 2400 | 6<br>2401 to 2880 | 7<br>2881 to 3360 | 8<br>3361 to 3840 |
|---|---|---|---|---|---|---|---|---|
| 83 | 0 | 0 | 0 | 0 | 0 | 0 | 0 | 0 |
| 82.9 | 0 | 0 | 0 | 0 | 0 | 0 | 0 | 0 |
| 82.8 | 0 | 0 | 0 | 0 | 0 | 0 | 0 | 0 |
| 82.7 | 0 | 0 | 0 | 0 | 0 | 0 | 0 | 0 |
| 82.6 | 0 | 0 | 0 | 0 | 0 | 0 | 0 | 0 |
| 82.5 | 3 | 2 | 0 | 0 | 0 | 0 | 0 | 0 |
| 82.4 | 2 | 1 | 3 | 0 | 0 | 0 | 0 | 0 |
| 82.3 | 1 | 2 | 1 | 3 | 2 | 0 | 0 | 0 |
| 82.2 | 2 | 2 | 2 | 2 | 2 | 3 | 0 | 0 |
| 82.1 | 17 | 12 | 2 | 1 | 2 | 1 | 3 | 2 |
| 82 | 6 | 9 | 14 | 5 | 1 | 2 | 2 | 2 |
| 81.9 | 9 | 6 | 7 | 14 | 12 | 2 | 1 | 2 |
| 81.8 | 13 | 12 | 5 | 8 | 10 | 16 | 7 | 1 |
| 81.7 | 15 | 10 | 16 | 10 | 5 | 5 | 12 | 12 |
| 81.6 | 15 | 21 | 15 | 11 | 12 | 7 | 8 | 10 |
| 81.5 | 8 | 9 | 16 | 17 | 14 | 17 | 11 | 5 |
| 81.4 | 16 | 11 | 6 | 13 | 19 | 13 | 11 | 13 |
| 81.3 | 8 | 12 | 16 | 8 | 8 | 15 | 17 | 15 |
| 81.2 | 12 | 10 | 9 | 15 | 12 | 8 | 12 | 17 |
| 81.1 | 14 | 15 | 12 | 10 | 11 | 14 | 9 | 8 |
| 81 | 10 | 13 | 13 | 10 | 10 | 11 | 15 | 13 |
| 80.9 | 11 | 7 | 12 | 17 | 15 | 10 | 10 | 12 |
| 80.8 | 12 | 12 | 8 | 7 | 12 | 14 | 10 | 9 |
| 80.7 | 7 | 9 | 14 | 12 | 8 | 11 | 18 | 14 |
| 80.6 | 12 | 10 | 8 | 12 | 14 | 9 | 5 | 13 |
| 80.5 | 7 | 13 | 11 | 6 | 8 | 15 | 12 | 7 |
| 80.4 | 3 | 3 | 9 | 14 | 9 | 7 | 12 | 15 |
| 80.3 | 6 | 3 | 4 | 5 | 12 | 11 | 7 | 7 |
| 80.2 | 10 | 10 | 4 | 3 | 3 | 8 | 14 | 9 |
| 80.1 | 8 | 8 | 11 | 7 | 4 | 4 | 4 | 12 |
| 80 | 10 | 9 | 7 | 10 | 11 | 4 | 3 | 3 |
| 79.9 | 11 | 13 | 8 | 7 | 7 | 11 | 9 | 4 |
| 79.8 | 2 | 4 | 14 | 12 | 9 | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |

| | | | | | | | | |
|---|---|---|---|---|---|---|---|---|
| 79.8 | 2 | 4 | | | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |
| 79.1 | 2 | 3 | 8 | 11 | 6 | 7 | 10 | 13 |
| 79 | 14 | 8 | 2 | 4 | 10 | 10 | 5 | 7 |
| 78.9 | 11 | 8 | 11 | 3 | 3 | 6 | 10 | 7 |
| 78.8 | 10 | 11 | 8 | 12 | 8 | 2 | 4 | 9 |
| 78.7 | 14 | 12 | 14 | 11 | 8 | 11 | 5 | 3 |
| 78.6 | 9 | 10 | 13 | 10 | 13 | 9 | 11 | 9 |
| 78.5 | 14 | 11 | 8 | 14 | 11 | 13 | 11 | 8 |
| 78.4 | 8 | 16 | 14 | 9 | 10 | 15 | 11 | 13 |
| 78.3 | 17 | 7 | 11 | 16 | 13 | 6 | 12 | 13 |
| 78.2 | 22 | 21 | 15 | 6 | 13 | 15 | 10 | 7 |
| 78.1 | 11 | 19 | 22 | 18 | 8 | 10 | 15 | 14 |
| 78 | 10 | 11 | 9 | 21 | 21 | 17 | 7 | 13 |
| 77.9 | 8 | 8 | 13 | 13 | 19 | 22 | 20 | 9 |
| 77.8 | 14 | 14 | 7 | 8 | 10 | 7 | 18 | 22 |
| 77.7 | 8 | 9 | 15 | 9 | 9 | 13 | 13 | 17 |
| 77.6 | 5 | 10 | 7 | 13 | 14 | 9 | 9 | 9 |
| 77.5 | 2 | 1 | 8 | 9 | 8 | 13 | 10 | 9 |
| 77.4 | 1 | 2 | 1 | 4 | 10 | 9 | 11 | 14 |
| 77.3 | 2 | 2 | 2 | 2 | 1 | 6 | 10 | 9 |
| 77.2 | 3 | 0 | 2 | 1 | 2 | 2 | 4 | 9 |
| 77.1 | 2 | 4 | 1 | 2 | 2 | 1 | 2 | 1 |
| 77 | 0 | 1 | 4 | 3 | 0 | 2 | 0 | 2 |
| 76.9 | 0 | 0 | 0 | 2 | 5 | 1 | 2 | 2 |
| 76.8 | 0 | 0 | 0 | 0 | 0 | 4 | 4 | 1 |
| 76.7 | 0 | 0 | 0 | 0 | 0 | 0 | 1 | 4 |
| 76.6 | 0 | 0 | 0 | 0 | 0 | 0 | 0 | 0 |
| 76.5 | 0 | 0 | 0 | 0 | 0 | 0 | 0 | 0 |
| 76.4 | 0 | 0 | 0 | 0 | 0 | 0 | 0 | 0 |
| 76.3 | 0 | 0 | 0 | 0 | 0 | 0 | 0 | 0 |
| 76.2 | 0 | 0 | 0 | 0 | 0 | 0 | 0 | 0 |
| 76.1 | 0 | 0 | 0 | 0 | 0 | 0 | 0 | 0 |
| 76 | 0 | 0 | 0 | 0 | 0 | 0 | 0 | 0 |

FIG. 16

| UNIT PERIOD / MEASUREMENT SECTION / CLASS | 1 (1 to 480) | 2 (481 to 960) | 3 (961 to 1440) | 4 (1441 to 1920) | 5 (1921 to 2400) | 6 (2401 to 2880) | 7 (2881 to 3360) | 8 (3361 to 3840) |
|---|---|---|---|---|---|---|---|---|
| 83 | 0 | 0 | 0 | 0 | 0 | 0 | 0 | 0 |
| 82.9 | 0 | 0 | 0 | 0 | 0 | 0 | 0 | 0 |
| 82.8 | 0 | 0 | 0 | 0 | 0 | 0 | 0 | 0 |
| 82.7 | 0 | 0 | 0 | 0 | 0 | 0 | 0 | 0 |
| 82.6 | 0 | 0 | 0 | 0 | 0 | 0 | 0 | 0 |
| 82.5 | 3 | 2 | 0 | 0 | 0 | 0 | 0 | 0 |
| 82.4 | 2 | 1 | 3 | 0 | 0 | 0 | 0 | 0 |
| 82.3 | 1 | 2 | 1 | 3 | 2 | 0 | 0 | 0 |
| 82.2 | 2 | 2 | 2 | 2 | 2 | 3 | 0 | 0 |
| 82.1 | 17 | 12 | 2 | 1 | 2 | 1 | 3 | 2 |
| 82 | 6 | 9 | 14 | 5 | 1 | 2 | 2 | 2 |
| 81.9 | 9 | 6 | 7 | 14 | 12 | 2 | 1 | 2 |
| 81.8 | 13 | 12 | 5 | 8 | 10 | 16 | 7 | 1 |
| 81.7 | 15 | 10 | 16 | 10 | 5 | 5 | 12 | 12 |
| 81.6 | 15 | 21 | 15 | 11 | 12 | 7 | 8 | 10 |
| 81.5 | 8 | 9 | 16 | 17 | 14 | 17 | 11 | 5 |
| 81.4 | 16 | 11 | 6 | 13 | 19 | 13 | 11 | 13 |
| 81.3 | 8 | 12 | 16 | 8 | 8 | 15 | 17 | 15 |
| 81.2 | 12 | 10 | 9 | 15 | 12 | 8 | 12 | 17 |
| 81.1 | 14 | 15 | 12 | 10 | 11 | 14 | 9 | 8 |
| 81 | 10 | 13 | 13 | 10 | 10 | 11 | 15 | 13 |
| 80.9 | 11 | 7 | 12 | 17 | 15 | 10 | 10 | 12 |
| 80.8 | 12 | 12 | 8 | 7 | 12 | 14 | 10 | 9 |
| 80.7 | 7 | 9 | 14 | 12 | 8 | 11 | 18 | 14 |
| 80.6 | 12 | 10 | 8 | 12 | 14 | 9 | 5 | 13 |
| 80.5 | 7 | 13 | 11 | 6 | 8 | 15 | 12 | 7 |
| 80.4 | 3 | 3 | 9 | 14 | 9 | 7 | 12 | 15 |
| 80.3 | 6 | 3 | 4 | 5 | 12 | 11 | 7 | 7 |
| 80.2 | 10 | 10 | 4 | 3 | 3 | 8 | 14 | 9 |
| 80.1 | 8 | 8 | 11 | 7 | 4 | 4 | 4 | 12 |
| 80 | 10 | 9 | 7 | 10 | 11 | 4 | 3 | 3 |
| 79.9 | 11 | 13 | 8 | 7 | 7 | 11 | 9 | 4 |
| 79.8 | 2 | 4 | 14 | 12 | 9 | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |

| | | | | | | | | |
|---|---|---|---|---|---|---|---|---|
| 79.8 | 2 | 4 | | | 7 | 8 | 12 | |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |
| 79.1 | 2 | 3 | 8 | 11 | 6 | 7 | 10 | 13 |
| 79 | 14 | 8 | 2 | 4 | 10 | 10 | 5 | 7 |
| 78.9 | 11 | 8 | 11 | 3 | 3 | 6 | 10 | 7 |
| 78.8 | 10 | 11 | 8 | 12 | 8 | 2 | 4 | 9 |
| 78.7 | 14 | 12 | 14 | 11 | 8 | 11 | 5 | 3 |
| 78.6 | 9 | 10 | 13 | 10 | 13 | 9 | 11 | 9 |
| 78.5 | 14 | 11 | 8 | 14 | 11 | 13 | 11 | 8 |
| 78.4 | 8 | 16 | 14 | 9 | 10 | 15 | 11 | 13 |
| 78.3 | 17 | 7 | 11 | 16 | 13 | 6 | 12 | 13 |
| 78.2 | 22 | 21 | 15 | 6 | 13 | 15 | 10 | 7 |
| 78.1 | 11 | 19 | 22 | 18 | 8 | 10 | 15 | 14 |
| 78 | 10 | 11 | 9 | 21 | 21 | 17 | 7 | 13 |
| 77.9 | 8 | 8 | 13 | 13 | 19 | 22 | 20 | 9 |
| 77.8 | 14 | 14 | 7 | 8 | 10 | 7 | 18 | 22 |
| 77.7 | 8 | 9 | 15 | 9 | 9 | 13 | 13 | 17 |
| 77.6 | 5 | 10 | 7 | 13 | 14 | 9 | 9 | 9 |
| 77.5 | 2 | 1 | 8 | 9 | 8 | 13 | 10 | 9 |
| 77.4 | 1 | 2 | 1 | 4 | 10 | 9 | 11 | 14 |
| 77.3 | 2 | 2 | 2 | 2 | 1 | 6 | 10 | 9 |
| 77.2 | 3 | 0 | 2 | 1 | 2 | 2 | 4 | 9 |
| 77.1 | 2 | 4 | 1 | 2 | 2 | 1 | 2 | 1 |
| 77 | 0 | 1 | 4 | 3 | 0 | 2 | 0 | 2 |
| 76.9 | 0 | 0 | 0 | 2 | 5 | 1 | 2 | 2 |
| 76.8 | 0 | 0 | 0 | 0 | 0 | 4 | 4 | 1 |
| 76.7 | 0 | 0 | 0 | 0 | 0 | 0 | 1 | 4 |
| 76.6 | 0 | 0 | 0 | 0 | 0 | 0 | 0 | 0 |
| 76.5 | 0 | 0 | 0 | 0 | 0 | 0 | 0 | 0 |
| 76.4 | 0 | 0 | 0 | 0 | 0 | 0 | 0 | 0 |
| 76.3 | 0 | 0 | 0 | 0 | 0 | 0 | 0 | 0 |
| 76.2 | 0 | 0 | 0 | 0 | 0 | 0 | 0 | 0 |
| 76.1 | 0 | 0 | 0 | 0 | 0 | 0 | 0 | 0 |
| 76 | 0 | 0 | 0 | 0 | 0 | 0 | 0 | 0 |

FIG. 19

| UNIT PERIOD / MEASUREMENT SECTION / CLASS | 1<br>1 to 480 | 2<br>481 to 960 | 3<br>961 to 1440 | 4<br>1441 to 1920 | 5<br>1921 to 2400 | 6<br>2401 to 2880 | 7<br>2881 to 3360 | 8<br>3361 to 3840 |
|---|---|---|---|---|---|---|---|---|
| 83 | 0 | 0 | 0 | 0 | 0 | 0 | 0 | 0 |
| 82.9 | 0 | 0 | 0 | 0 | 0 | 0 | 0 | 0 |
| 82.8 | 0 | 0 | 0 | 0 | 0 | 0 | 0 | 0 |
| 82.7 | 0 | 0 | 0 | 0 | 0 | 0 | 0 | 0 |
| 82.6 | 0 | 0 | 0 | 0 | 0 | 0 | 0 | 0 |
| 82.5 | 3 | 2 | 0 | 0 | 0 | 0 | 0 | 0 |
| 82.4 | 2 | 1 | 3 | 0 | 0 | 0 | 0 | 0 |
| 82.3 | 1 | 2 | 1 | 3 | 2 | 0 | 0 | 0 |
| 82.2 | 2 | 2 | 2 | 2 | 2 | 3 | 0 | 0 |
| 82.1 | 17 | 12 | 2 | 1 | 2 | 1 | 3 | 2 |
| 82 | 6 | 9 | 14 | 5 | 1 | 2 | 2 | 2 |
| 81.9 | 9 | 6 | 7 | 14 | 12 | 2 | 1 | 2 |
| 81.8 | 13 | 12 | 5 | 8 | 10 | 16 | 7 | 1 |
| 81.7 | 15 | 10 | 16 | 10 | 5 | 5 | 12 | 12 |
| 81.6 | 15 | 21 | 15 | 11 | 12 | 7 | 8 | 10 |
| 81.5 | 8 | 9 | 16 | 17 | 14 | 17 | 11 | 5 |
| 81.4 | 16 | 11 | 6 | 13 | 19 | 13 | 11 | 13 |
| 81.3 | 8 | 12 | 16 | 8 | 8 | 15 | 17 | 15 |
| 81.2 | 12 | 10 | 9 | 15 | 12 | 8 | 12 | 17 — 11c |
| 81.1 | 14 | 15 | 12 | 10 | 11 | 14 | 9 | 8 |
| 81 | 10 | 13 | 13 | 10 | 10 | 11 | 15 | 13 |
| 80.9 | 11 | 7 | 12 | 17 | 15 | 10 | 10 | 12 |
| 80.8 | 12 | 12 | 8 | 7 | 12 | 14 | 10 | 9 |
| 80.7 | 7 | 9 | 14 | 12 | 8 | 11 | 18 | 14 |
| 80.6 | 12 | 10 | 8 | 12 | 14 | 9 | 5 | 13 |
| 80.5 | 7 | 13 | 11 | 6 | 8 | 15 | 12 | 7 |
| 80.4 | 3 | 3 | 9 | 14 | 9 | 7 | 12 | 15 |
| 80.3 | 6 | 3 | 4 | 5 | 12 | 11 | 7 | 7 |
| 80.2 | 10 | 10 | 4 | 3 | 3 | 8 | 14 | 9 |
| 80.1 | 8 | 8 | 11 | 7 | 4 | 4 | 4 | 12 |
| 80 | 10 | 9 | 7 | 10 | 11 | 4 | 3 | 3 |
| 79.9 | 11 | 13 | 8 | 7 | 7 | 11 | 9 | 4 |
| 79.8 | 2 | 4 | 14 | 12 | 9 | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |

FIG. 20

| | | | | | | | | |
|---|---|---|---|---|---|---|---|---|
| 79.8 | 2 | 4 | | | | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |
| 79.1 | 2 | 3 | 8 | 11 | 6 | 7 | 10 | 13 |
| 79 | 14 | 8 | 2 | 4 | 10 | 10 | 5 | 7 |
| 78.9 | 11 | 8 | 11 | 3 | 3 | 6 | 10 | 7 |
| 78.8 | 10 | 11 | 8 | 12 | 8 | 2 | 4 | 9 |
| 78.7 | 14 | 12 | 14 | 11 | 8 | 11 | 5 | 3 |
| 78.6 | 9 | 10 | 13 | 10 | 13 | 9 | 11 | 9 |
| 78.5 | 14 | 11 | 8 | 14 | 11 | 13 | 11 | 8 |
| 78.4 | 8 | 16 | 14 | 9 | 10 | 15 | 11 | 13 |
| 78.3 | 17 | 7 | 11 | 16 | 13 | 6 | 12 | 13 |
| 78.2 | 22 | 21 | 15 | 6 | 13 | 15 | 10 | 7 |
| 78.1 | 11 | 19 | 22 | 18 | 8 | 10 | 15 | 14 |
| 78 | 10 | 11 | 9 | 21 | 21 | 17 | 7 | 13 |
| 77.9 | 8 | 8 | 13 | 13 | 19 | 22 | 20 | 9 |
| 77.8 | 14 | 14 | 7 | 8 | 10 | 7 | 18 | 22 |
| 77.7 | 8 | 9 | 15 | 9 | 9 | 13 | 13 | 17 |
| 77.6 | 5 | 10 | 7 | 13 | 14 | 9 | 9 | 9 |
| 77.5 | 2 | 1 | 8 | 9 | 8 | 13 | 10 | 9 |
| 77.4 | 1 | 2 | 1 | 4 | 10 | 9 | 11 | 14 |
| 77.3 | 2 | 2 | 2 | 2 | 1 | 6 | 10 | 9 |
| 77.2 | 3 | 0 | 2 | 1 | 2 | 2 | 4 | 9 |
| 77.1 | 2 | 4 | 1 | 2 | 2 | 1 | 2 | 1 |
| 77 | 0 | 1 | 4 | 3 | 0 | 2 | 0 | 2 |
| 76.9 | 0 | 0 | 0 | 2 | 5 | 1 | 2 | 2 |
| 76.8 | 0 | 0 | 0 | 0 | 0 | 4 | 4 | 1 |
| 76.7 | 0 | 0 | 0 | 0 | 0 | 0 | 1 | 4 |
| 76.6 | 0 | 0 | 0 | 0 | 0 | 0 | 0 | 0 |
| 76.5 | 0 | 0 | 0 | 0 | 0 | 0 | 0 | 0 |
| 76.4 | 0 | 0 | 0 | 0 | 0 | 0 | 0 | 0 |
| 76.3 | 0 | 0 | 0 | 0 | 0 | 0 | 0 | 0 |
| 76.2 | 0 | 0 | 0 | 0 | 0 | 0 | 0 | 0 |
| 76.1 | 0 | 0 | 0 | 0 | 0 | 0 | 0 | 0 |
| 76 | 0 | 0 | 0 | 0 | 0 | 0 | 0 | 0 |

FIG. 22

| UNIT PERIOD | 1 | 2 | 3 | 4 | 5 | 6 | 7 | 8 |
|---|---|---|---|---|---|---|---|---|
| MEASUREMENT SECTION / CLASS | 1 to 480 | 481 to 960 | 961 to 1440 | 1441 to 1920 | 1921 to 2400 | 2401 to 2880 | 2881 to 3360 | 3361 to 3840 |
| 83 | 0 | 0 | 0 | 0 | 0 | 0 | 0 | 0 |
| 82.9 | 0 | 0 | 0 | 0 | 0 | 0 | 0 | 0 |
| 82.8 | 0 | 0 | 0 | 0 | 0 | 0 | 0 | 0 |
| 82.7 | 0 | 0 | 0 | 0 | 0 | 0 | 0 | 0 |
| 82.6 | 0 | 0 | 0 | 0 | 0 | 0 | 0 | 0 |
| 82.5 | 3 | 2 | 0 | 0 | 0 | 0 | 0 | 0 |
| 82.4 | 2 | 1 | 3 | 0 | 0 | 0 | 0 | 0 |
| 82.3 | 1 | 2 | 1 | 3 | 2 | 0 | 0 | 0 |
| 82.2 | 2 | 2 | 2 | 2 | 2 | 3 | 0 | 0 |
| 82.1 | 17 | 12 | 2 | 1 | 2 | 1 | 3 | 2 |
| 82 | 6 | 9 | 14 | 5 | 1 | 2 | 2 | 2 |
| 81.9 | 9 | 6 | 7 | 14 | 12 | 2 | 1 | 2 |
| 81.8 | 13 | 12 | 5 | 8 | 10 | 16 | 7 | 1 |
| 81.7 | 15 | 10 | 16 | 10 | 5 | 5 | 12 | 12 |
| 81.6 | 15 | 21 | 15 | 11 | 12 | 7 | 8 | 10 |
| 81.5 | 8 | 9 | 16 | 17 | 14 | 17 | 11 | 5 |
| 81.4 | 16 | 11 | 6 | 13 | 19 | 13 | 11 | 13 |
| 81.3 | 8 | 12 | 16 | 8 | 8 | 15 | 17 | 15 |
| 81.2 | 12 | 10 | 9 | 15 | 12 | 8 | 12 | 17 |
| 81.1 | 14 | 15 | 12 | 10 | 11 | 14 | 9 | 8 |
| 81 | 10 | 13 | 13 | 10 | 10 | 11 | 15 | 13 |
| 80.9 | 11 | 7 | 12 | 17 | 15 | 10 | 10 | 12 |
| 80.8 | 12 | 12 | 8 | 7 | 12 | 14 | 10 | 9 |
| 80.7 | 7 | 9 | 14 | 12 | 8 | 11 | 18 | 14 |
| 80.6 | 12 | 10 | 8 | 12 | 14 | 9 | 5 | 13 |
| 80.5 | 7 | 13 | 11 | 6 | 8 | 15 | 12 | 7 |
| 80.4 | 3 | 3 | 9 | 14 | 9 | 7 | 12 | 15 |
| 80.3 | 6 | 3 | 4 | 5 | 12 | 11 | 7 | 7 |
| 80.2 | 10 | 10 | 4 | 3 | 3 | 8 | 14 | 9 |
| 80.1 | 8 | 8 | 11 | 7 | 4 | 4 | 4 | 12 |
| 80 | 10 | 9 | 7 | 10 | 11 | 4 | 3 | 3 |
| 79.9 | 11 | 13 | 8 | 7 | 7 | 11 | 9 | 4 |
| 79.8 | 2 | 4 | 14 | 12 | 9 | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |

| | | | | | | | | |
|---|---|---|---|---|---|---|---|---|
| 79.8 | 2 | 4 | | | 7 | 8 | 12 | |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |
| 79.1 | 2 | 3 | 8 | 11 | 6 | 7 | 10 | 13 |
| 79 | 14 | 8 | 2 | 4 | 10 | 10 | 5 | 7 |
| 78.9 | 11 | 8 | 11 | 3 | 3 | 6 | 10 | 7 |
| 78.8 | 10 | 11 | 8 | 12 | 8 | 2 | 4 | 9 |
| 78.7 | 14 | 12 | 14 | 11 | 8 | 11 | 5 | 3 |
| 78.6 | 9 | 10 | 13 | 10 | 13 | 9 | 11 | 9 |
| 78.5 | 14 | 11 | 8 | 14 | 11 | 13 | 11 | 8 |
| 78.4 | 8 | 16 | 14 | 9 | 10 | 15 | 11 | 13 |
| 78.3 | 17 | 7 | 11 | 16 | 13 | 6 | 12 | 13 |
| 78.2 | 22 | 21 | 15 | 6 | 13 | 15 | 10 | 7 |
| 78.1 | 11 | 19 | 22 | 18 | 8 | 10 | 15 | 14 |
| 78 | 10 | 11 | 9 | 21 | 21 | 17 | 7 | 13 |
| 77.9 | 8 | 8 | 13 | 13 | 19 | 22 | 20 | 9 |
| 77.8 | 14 | 14 | 7 | 8 | 10 | 7 | 18 | 22 |
| 77.7 | 8 | 9 | 15 | 9 | 9 | 13 | 13 | 17 |
| 77.6 | 5 | 10 | 7 | 13 | 14 | 9 | 9 | 9 |
| 77.5 | 2 | 1 | 8 | 9 | 8 | 13 | 10 | 9 |
| 77.4 | 1 | 2 | 1 | 4 | 10 | 9 | 11 | 14 |
| 77.3 | 2 | 2 | 2 | 2 | 1 | 6 | 10 | 9 |
| 77.2 | 3 | 0 | 2 | 1 | 2 | 2 | 4 | 9 |
| 77.1 | 2 | 4 | 1 | 2 | 2 | 1 | 2 | 1 |
| 77 | 0 | 1 | 4 | 3 | 0 | 2 | 0 | 2 |
| 76.9 | 0 | 0 | 0 | 2 | 5 | 1 | 2 | 2 |
| 76.8 | 0 | 0 | 0 | 0 | 0 | 4 | 4 | 1 |
| 76.7 | 0 | 0 | 0 | 0 | 0 | 0 | 1 | 4 |
| 76.6 | 0 | 0 | 0 | 0 | 0 | 0 | 0 | 0 |
| 76.5 | 0 | 0 | 0 | 0 | 0 | 0 | 0 | 0 |
| 76.4 | 0 | 0 | 0 | 0 | 0 | 0 | 0 | 0 |
| 76.3 | 0 | 0 | 0 | 0 | 0 | 0 | 0 | 0 |
| 76.2 | 0 | 0 | 0 | 0 | 0 | 0 | 0 | 0 |
| 76.1 | 0 | 0 | 0 | 0 | 0 | 0 | 0 | 0 |
| 76 | 0 | 0 | 0 | 0 | 0 | 0 | 0 | 0 |

FIG. 25

| UNIT PERIOD / MEASUREMENT SECTION / CLASS | 1 (1 to 480) | 2 (481 to 960) | 3 (961 to 1440) | 4 (1441 to 1920) | 5 (1921 to 2400) | 6 (2401 to 2880) | 7 (2881 to 3360) | 8 (3361 to 3840) |
|---|---|---|---|---|---|---|---|---|
| 83 | 0 | 0 | 0 | 0 | 0 | 0 | 0 | 0 |
| 82.9 | 0 | 0 | 0 | 0 | 0 | 0 | 0 | 0 |
| 82.8 | 0 | 0 | 0 | 0 | 0 | 0 | 0 | 0 |
| 82.7 | 0 | 0 | 0 | 0 | 0 | 0 | 0 | 0 |
| 82.6 | 0 | 0 | 0 | 0 | 0 | 0 | 0 | 0 |
| 82.5 | 3 | 2 | 0 | 0 | 0 | 0 | 0 | 0 |
| 82.4 | 2 | 1 | 3 | 0 | 0 | 0 | 0 | 0 |
| 82.3 | 1 | 2 | 1 | 3 | 2 | 0 | 0 | 0 |
| 82.2 | 2 | 2 | 2 | 2 | 2 | 3 | 0 | 0 |
| 82.1 | 17 | 12 | 2 | 1 | 2 | 1 | 3 | 2 |
| 82 | 6 | 9 | 14 | 5 | 1 | 2 | 2 | 2 |
| 81.9 | 9 | 6 | 7 | 14 | 12 | 2 | 1 | 2 |
| 81.8 | 13 | 12 | 5 | 8 | 10 | 16 | 7 | 1 |
| 81.7 | 15 | 10 | 16 | 10 | 5 | 5 | 12 | 12 |
| 81.6 | 15 | 21 | 15 | 11 | 12 | 7 | 8 | 10 |
| 81.5 | 8 | 9 | 16 | 17 | 14 | 17 | 11 | 5 |
| 81.4 | 16 | 11 | 6 | 13 | 19 | 13 | 11 | 13 |
| 81.3 | 8 | 12 | 16 | 8 | 8 | 15 | 17 | 15 |
| 81.2 | 12 | 10 | 9 | 15 | 12 | 8 | 12 | 17 |
| 81.1 | 14 | 15 | 12 | 10 | 11 | 14 | 9 | 8 |
| 81 | 10 | 13 | 13 | 10 | 10 | 11 | 15 | 13 |
| 80.9 | 11 | 7 | 12 | 17 | 15 | 10 | 10 | 12 |
| 80.8 | 12 | 12 | 8 | 7 | 12 | 14 | 10 | 9 |
| 80.7 | 7 | 9 | 14 | 12 | 8 | 11 | 18 | 14 |
| 80.6 | 12 | 10 | 8 | 12 | 14 | 9 | 5 | 13 |
| 80.5 | 7 | 13 | 11 | 6 | 8 | 15 | 12 | 7 |
| 80.4 | 3 | 3 | 9 | 14 | 9 | 7 | 12 | 15 |
| 80.3 | 6 | 3 | 4 | 5 | 12 | 11 | 7 | 7 |
| 80.2 | 10 | 10 | 4 | 3 | 3 | 8 | 14 | 9 |
| 80.1 | 8 | 8 | 11 | 7 | 4 | 4 | 4 | 12 |
| 80 | 10 | 9 | 7 | 10 | 11 | 4 | 3 | 3 |
| 79.9 | 11 | 13 | 8 | 7 | 7 | 11 | 9 | 4 |
| 79.8 | 2 | 4 | 14 | 12 | 9 | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |

| | | | | | | | | |
|---|---|---|---|---|---|---|---|---|
| 79.8 | 2 | 4 | | | 7 | 8 | 12 |
| 79.7 | 4 | 2 | 2 | 9 | 14 | 9 | 7 | 7 |
| 79.6 | 9 | 6 | 3 | 2 | 2 | 13 | 12 | 8 |
| 79.5 | 8 | 11 | 7 | 4 | 3 | 2 | 9 | 14 |
| 79.4 | 7 | 9 | 10 | 10 | 5 | 4 | 2 | 2 |
| 79.3 | 12 | 5 | 8 | 9 | 12 | 7 | 4 | 3 |
| 79.2 | 3 | 11 | 8 | 6 | 8 | 10 | 11 | 5 |
| 79.1 | 2 | 3 | 8 | 11 | 6 | 7 | 10 | 13 |
| 79 | 14 | 8 | 2 | 4 | 10 | 10 | 5 | 7 |
| 78.9 | 11 | 8 | 11 | 3 | 3 | 6 | 10 | 7 |
| 78.8 | 10 | 11 | 8 | 12 | 8 | 2 | 4 | 9 |
| 78.7 | 14 | 12 | 14 | 11 | 8 | 11 | 5 | 3 |
| 78.6 | 9 | 10 | 13 | 10 | 13 | 9 | 11 | 9 |
| 78.5 | 14 | 11 | 8 | 14 | 11 | 13 | 11 | 8 |
| 78.4 | 8 | 16 | 14 | 9 | 10 | 15 | 11 | 13 |
| 78.3 | 17 | 7 | 11 | 16 | 13 | 6 | 12 | 13 |
| 78.2 | 22 | 21 | 15 | 6 | 13 | 15 | 10 | 7 |
| 78.1 | 11 | 19 | 22 | 18 | 8 | 10 | 15 | 14 |
| 78 | 10 | 11 | 9 | 21 | 21 | 17 | 7 | 13 |
| 77.9 | 8 | 8 | 13 | 13 | 19 | 22 | 20 | 9 |
| 77.8 | 14 | 14 | 7 | 8 | 10 | 7 | 18 | 22 |
| 77.7 | 8 | 9 | 15 | 9 | 9 | 13 | 13 | 17 |
| 77.6 | 5 | 10 | 7 | 13 | 14 | 9 | 9 | 9 |
| 77.5 | 2 | 1 | 8 | 9 | 8 | 13 | 10 | 9 |
| 77.4 | 1 | 2 | 1 | 4 | 10 | 9 | 11 | 14 |
| 77.3 | 2 | 2 | 2 | 2 | 1 | 6 | 10 | 9 |
| 77.2 | 3 | 0 | 2 | 1 | 2 | 2 | 4 | 9 |
| 77.1 | 2 | 4 | 1 | 2 | 2 | 1 | 2 | 1 |
| 77 | 0 | 1 | 4 | 3 | 0 | 2 | 0 | 2 |
| 76.9 | 0 | 0 | 0 | 2 | 5 | 1 | 2 | 2 |
| 76.8 | 0 | 0 | 0 | 0 | 0 | 4 | 4 | 1 |
| 76.7 | 0 | 0 | 0 | 0 | 0 | 0 | 1 | 4 |
| 76.6 | 0 | 0 | 0 | 0 | 0 | 0 | 0 | 0 |
| 76.5 | 0 | 0 | 0 | 0 | 0 | 0 | 0 | 0 |
| 76.4 | 0 | 0 | 0 | 0 | 0 | 0 | 0 | 0 |
| 76.3 | 0 | 0 | 0 | 0 | 0 | 0 | 0 | 0 |
| 76.2 | 0 | 0 | 0 | 0 | 0 | 0 | 0 | 0 |
| 76.1 | 0 | 0 | 0 | 0 | 0 | 0 | 0 | 0 |
| 76 | 0 | 0 | 0 | 0 | 0 | 0 | 0 | 0 |

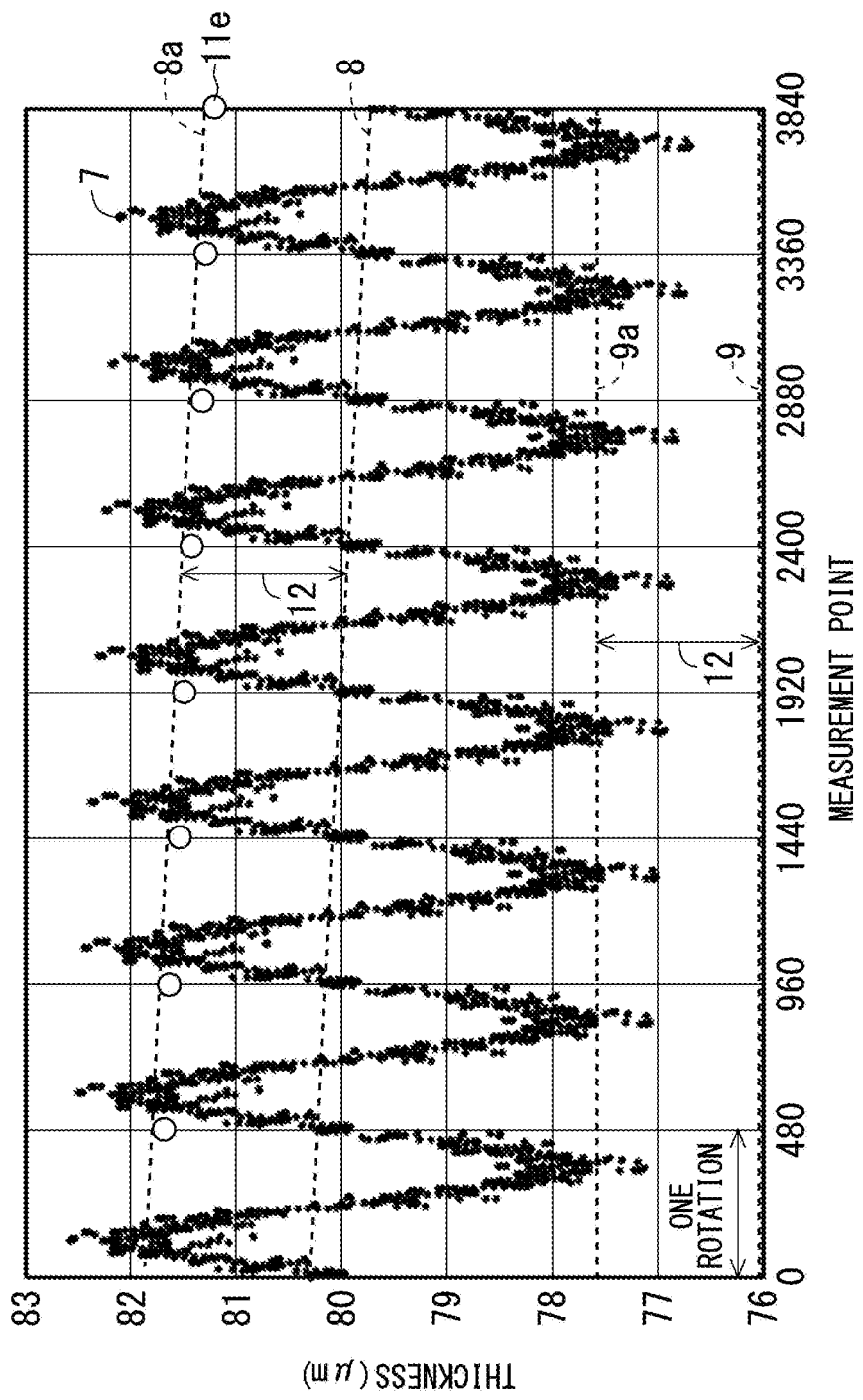

F I G . 2 8
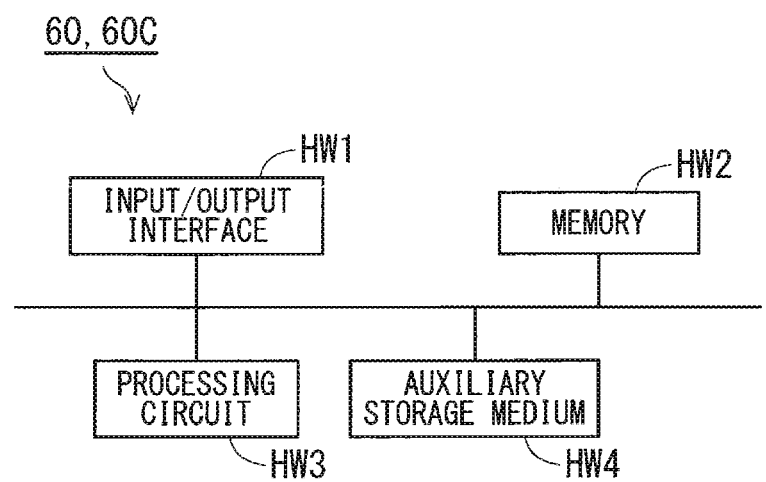

SEMICONDUCTOR MANUFACTURING EQUIPMENT AND SEMICONDUCTOR MANUFACTURING METHOD

TECHNICAL FIELD

The present invention relates to semiconductor manufacturing equipment and a semiconductor manufacturing method, and in particular to semiconductor manufacturing equipment for etching and a semiconductor manufacturing method using thereof.

BACKGROUND ART

According to Japanese Patent Application Laid-Open No. 2003-100702 (Patent Document 1), the etching device includes a substrate-holding rotation mechanism, an etchant supply mechanism, a film thickness measurement device, and control means. The substrate-holding rotation mechanism holds and rotates a substrate. The etchant supply mechanism supplies etchant on a film on the surface of the substrate that is being held and rotated by the substrate-holding rotation mechanism. The film thickness measurement device measures the film thickness of the film on the surface of the substrate that is held by the above substrate-holding rotation mechanism. The control means controls the supply of the etchant supplied by the above etchant supply mechanism based on the measurement result by the above film thickness measurement device while the above substrate is being held and rotated by the above substrate-holding rotation mechanism. The etching process is stopped when the measured film thickness reaches the target film thickness.

The above film thickness measurement device may include a light emitting unit, a light receiving unit, and a diffuser. The light emitting unit irradiates the target film to be measured with light. The light receiving unit receives reflected light from the target film to be measured. The diffuser which is disposed on the light receiving path leading from the target film to be measured to the above light receiving unit, diffuses the reflected light from the target film to be measured and emits toward the light receiving unit after homogenization. Accordingly, the above Patent Gazette claims that the reflected light from the target film to be measured is diffused and homogenized by the diffuser; therefore, the measurement of the film thickness is satisfactorily performed even while the target film to be measured is rotating.

PRIOR ART DOCUMENTS

Patent Documents

[Patent Document 1] Japanese Patent Application Laid-Open No. 2003-100702

SUMMARY

Problem to be Solved by the Invention

When film thickness measurement is performed on a rotating substrate, the diffuser is considered to be effective in stabilizing film thickness measurement at each moment. However, in view of the fact that the thickness non-uniformity within the wafer surface is usually unavoidable no matter how accurate the film thickness measurement at each time point is, the measurement results is affected by the variation depending on when the rotating wafer is measured. The above-mentioned prior art does not take the variation into consideration, and therefore, it may not be detected how the etching has progressed with sufficiently high accuracy. Thus, the difference between the finished thickness value and the target thickness value in the etching step can be large.

The present invention has been made to solve the above-described problems, and it is therefore an object of the present invention to provide semiconductor manufacturing equipment and a semiconductor manufacturing method, capable of suppressing the difference between the finished thickness value and the target thickness value in the etching step.

Means to Solve the Problem

The semiconductor manufacturing equipment includes a rotation mechanism, an etching mechanism, a thickness measurement function, an etching control function, and a thickness calculation function. The rotation mechanism is configured to rotate a wafer including an etched region which is to be etched at least partially. The etching mechanism is configured to etch the etched region. The thickness measurement function is configured to generate time-dependent thickness data by measuring a thickness of the etched region. The etching control function is configured to stop the etching mechanism when a representative value of thickness of the etched region reaches a target thickness value. Here, a period in which the wafer is rotated N times, where N is a natural number, represents "unit period", and a range which is read from the time-dependent thickness data during the unit period as measurement values represents "measurement section". The thickness calculation function is configured to calculate the representative value of thickness for each unit period based on the measurement values of the measurement section.

The semiconductor manufacturing method according to the present invention includes the following steps. Semiconductor manufacturing equipment is prepared. The equipment includes a rotation mechanism configured to rotate a wafer including an etched region which is to be etched at least partially, an etching mechanism configured to etch the etched region, a thickness measurement function configured to generate time-dependent thickness data by measuring a thickness of the etched region, an etching control function configured to stop the etching mechanism when a representative value of thickness of the etched region reaches a target thickness value, and a thickness calculation function configured to calculate the representative value of thickness for each unit period based on measurement values of a measurement section for each unit period. The wafer is processed by the use of the semiconductor manufacturing equipment.

Effects of the Invention

According to the present invention, the representative value of thickness is calculated for each unit period based on the measurement values of the measurement section. Therefore, the thickness of each position on the wafer about the rotational axis uniformly reflects more equally than in the case where such consideration as above on the rotation of the wafer is lacked. In other words, weighting values measured about the rotational axis are equalized. Therefore, etching progress for each unit period can be detected in high precision. Thus, the difference between the finished thickness value and the target thickness value in the etching step can be subsided. Needless to say, when the rotational speed changes during the etching, the unit period also changes according to the change in the rotational speed.

These and other objects, features, aspects and advantages of the present invention will become more apparent from the following detailed description of the present invention when taken in conjunction with the accompanying drawings.

BRIEF DESCRIPTION OF DRAWINGS

FIG. 2 A flowchart schematically illustrating the semiconductor manufacturing method according to Embodiment 1 of the present invention.

FIG. 5 A sectional view schematically illustrating one step in the specific example of the semiconductor manufacturing method according to Embodiment 1 of the present invention.

FIG. 6 A sectional view schematically illustrating one step in the specific example of the semiconductor manufacturing method according to Embodiment 1 of the present invention.

FIG. 10 A graph illustrating the endpoint detection technique according to Embodiment 2 of the present invention.

FIG. 11 A block diagram schematically illustrating a configuration of a thickness calculation function the semiconductor manufacturing equipment according to Embodiment 3 of the present invention has.

FIG. 13 A table illustrating a method for calculating the representative value of thickness from a frequency distribution in Working Example A according to Embodiment 3 of the present invention.

FIG. 14 The table illustrating what continued from FIG. 13.

FIG. 16 A table illustrating a method for calculating the representative values for the thickness from a frequency distribution in Working Example B according to Embodiment 3 of the present invention.

FIG. 17 The table illustrating what continued from FIG. 16.

FIG. 19 A table illustrating a method for calculating the representative values for the thickness from a frequency distribution in Working Example C according to Embodiment 3 of the present invention.

FIG. 20 The table illustrating what continued from FIG. 19.

FIG. 22 A table illustrating a method for calculating the representative values for the thickness from a frequency distribution in Working Example D according to Embodiment 3 of the present invention.

FIG. 23 The table illustrating what continued from FIG. 22.

FIG. 25 A table illustrating a method for calculating the representative values for the thickness from a frequency distribution in Working Example E according to Embodiment 3 of the present invention.

FIG. 26 The table illustrating what continued from FIG. 25.

FIG. 27 A graph illustrating measurement values and the representative values for the thickness in Working Example E according to Embodiment 3 of the present invention.

FIG. 28 A diagram illustrating an example of a hardware configuration of the semiconductor manufacturing equipment.

DESCRIPTION OF EMBODIMENTS

Figure 1:
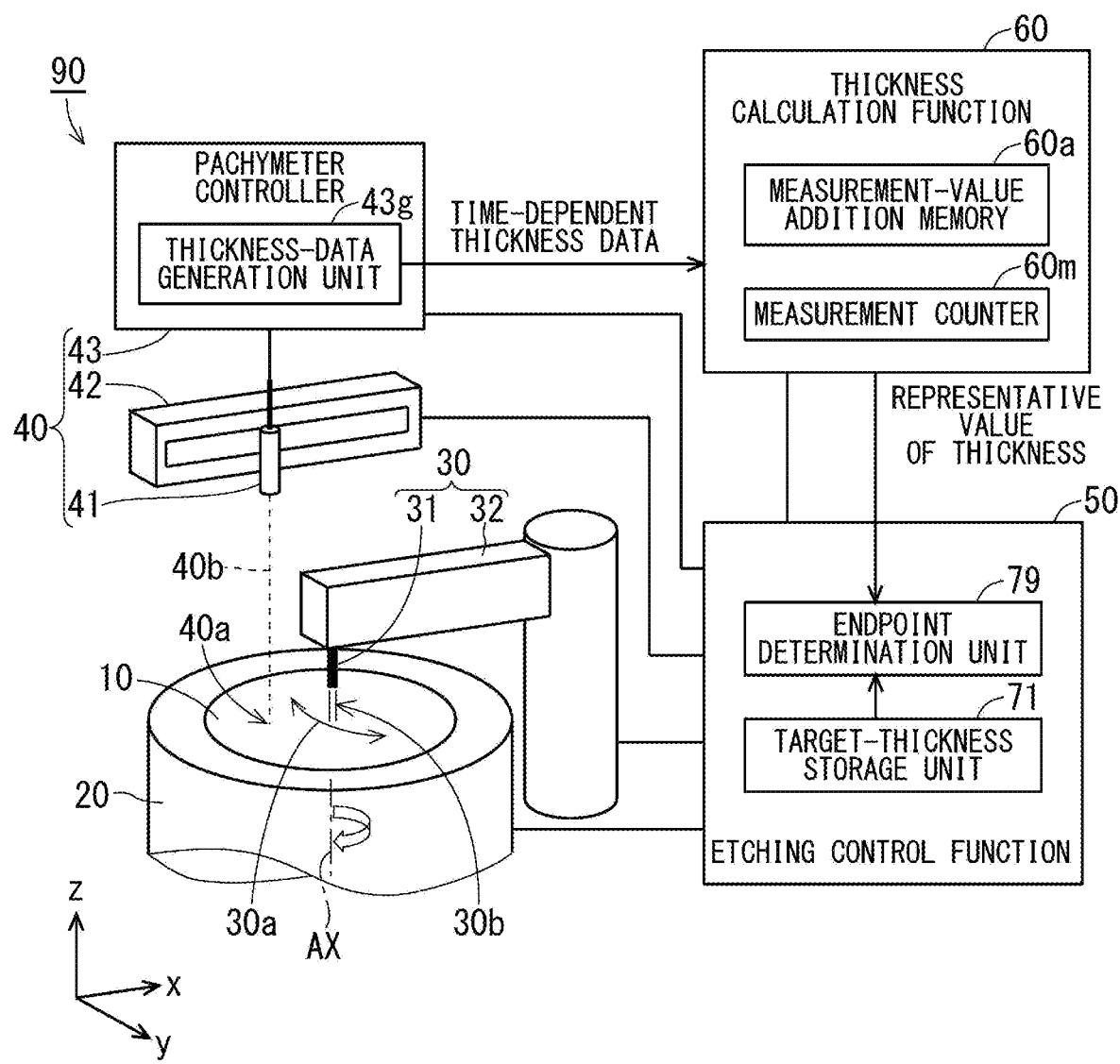
FIG. 1 A schematic diagram illustrating a processing system configuration of semiconductor manufacturing equipment according to Embodiment 1 of the present invention.

Hereinafter, Embodiments of the present invention is described with reference to the drawings. It should be noted that, in the following drawings, same or equivalent components are denoted by the same reference numerals and the descriptions thereof are not repeated.

Embodiment 1

(Semiconductor Manufacturing Equipment)

Referring to FIG. 1, the semiconductor manufacturing equipment according to Embodiment 1 is equipment that processes a wafer 10 by etching. The wafer 10 is either a semiconductor wafer alone or a semiconductor wafer having some structural layer thereon. The wafer 10 includes an etched region which is to be etched at least partially by a processing system 90 of the semiconductor manufacturing equipment. The etched region includes one of or both of the semiconductor wafer and the structural layer. The processing system 90 of the semiconductor manufacturing equipment includes a rotary stage 20 (rotation mechanism), an etchant supply unit 30 (etching mechanism), a thickness measurement function 40, an etching control function 50, and a thickness calculation function 60.

The rotary stage 20 holds the wafer 10 in parallel with an x-y plane. Also, the rotary stage 20 rotates the wafer 10 about the rotational axis AX which is parallel to a z-axis.

The etchant supply unit 30 supplies the wafer 10 with the etchant 30b thereon to wet etch the etched region. The start of supply of the etchant 30b starts the etching and the stop of supply of the etchant 30b stops the etching. The etchant supply unit 30 is provided with a nozzle 31 and an arm 32. The etchant 30b is discharged from the nozzle 31 and the arm 32 allows scanning of the position of the nozzle 31 as indicated by the scanning operation 30a.

The thickness measurement function 40 is provided with a sensor 41, a scanning mechanism 42, and a pachymeter controller 43. The sensor 41 measures the thickness of the etched region. For example, the sensor 41 detects the thickness of a measurement object by an interference optical system. The thickness measurement is performed at an endpoint detection position 40a in the wafer 10. The endpoint detection position 40a may be away from the rotational axis AX. The scanning mechanism 42 displaces the sensor 41 to adjust the endpoint detection position 40a, and may not be provided. The pachymeter controller 43 includes a thickness-data generation unit 43g. The thickness-data generation unit 43g generates time-dependent thickness data using the detection result from the sensor 41. The time-dependent thickness data is generated, typically, at previously fixed time intervals (sampling rate).

The etching control function 50 controls the rotary stage 20, the etchant supply unit 30, the thickness measurement function 40, and the thickness calculation function 60. The etching control function 50 includes a target-thickness storage unit 71 and an endpoint determination unit 79. The target-thickness storage unit 71 stores a target thickness value which is previously registered in a treatment menu selected at the time when the wafer 10 is placed on the semiconductor manufacturing equipment. The endpoint determination unit 79 compares the target thickness value with the representative value of thickness calculated by the thickness calculation function 60 and determines whether the representative value of thickness of the etched region has reached the target thickness value. When the representative value of thickness has reached the target thickness value, the etching control mechanism 50 determines that the endpoint of etching is detected and stops the etchant supply unit 30.

It should be noted that, in actual etching, there tend to be delays in the response of discharging the etchant and in the reaction to etching; therefore, an etching correction value may be set so that the target thickness value and the representative value of thickness of the etched region correspond with each other. In such a case, the target-thickness storage unit 71 may read out the target thickness value and the etching correction value previously registered in the treatment menu and store a value obtained by adding the etching correction value to the target thickness value as a new target thickness value.

The thickness calculation function 60 accepts the time-dependent thickness data from the thickness-data generation unit 43g of the thickness measurement function 40. The thickness calculation function 60 calculates the representative value of thickness of the etched region for each unit period based on measurement values of a measurement section. Note that the rotary stage 20 may transmit a trigger signal to the thickness calculation function 60 through etching control function 50 at each rotation so that the unit period can be grasped in high precision.

For example, when the rotation speed is constant and the sampling rate is constant, the number of measurement points obtained in each unit period is also theoretically constant. However, strictly speaking, the number of measurement points may slightly fluctuate due to the error of each operation. For example, the number of measurement points in a unit period is calculated as follows:

$$R \times 60 \times N/T = 4000 \times 60 \times 1/500 = 480 \text{ points}$$

wherein R represents the sampling rate and is 4 kHz, N represents natural number and is 1, T represents the rotation speed and is 500 rpm. However, the actual number of measurement points may slightly fluctuate due to the error of each operation, such as 476, 483, 479, 485 . . . .

(Summary of Semiconductor Manufacturing Method)

Specifically, the semiconductor manufacturing method according to Embodiment 1 is a method of processing the wafer 10 by etching. Therefore, the semiconductor manufacturing equipment is first to be prepared. Then, the wafer 10 is processed by the use of the processing system 90 (FIG. 1) of the semiconductor manufacturing equipment. This method is described below.

Further, referring to FIG. 2, the target-thickness storage unit 71 of the etching control function 50 stores the target thickness value in Step S10. In Step S20, the wafer 10 is loaded into the processing system 90 of the semiconductor manufacturing equipment and is held on the rotary stage 20. Note that the order of Steps S10 and S20 is set arbitrarily.

The etching starts in Step S30. Specifically, the rotary stage 20 starts to rotate by the instruction by the etching control function 50. Also, the instruction of the etching control function 50 starts monitoring of the thickness at the endpoint detected position 40a which is performed by the thickness measurement function 40 by the use of the sensor 41. In other words, the thickness-data generation unit 43g of the pachymeter controller 43 starts to generate the time-dependent thickness data. Also, the instruction of the etching control function 50 starts the etching by the etchant supply unit 30. Specifically, the nozzle 31 is moved, by the arm 32, above the wafer 10 and the etchant 30b is discharged from the nozzle 31. Accordingly, the etchant 30b is supplied over the etched region of the wafer 10. As a result, the etched region is started to be etched. The arm 32 may allow scanning of the position of the nozzle 31 as indicated by the scanning operation 30a with reciprocating movement along with the circular arc, so that to perform uniform etching.

In Step S40, the thickness calculation function 60 calculates the representative value of thickness of the etched region for each unit period based on measurement values of a measurement section. The movement state will be described in detail later.

In Step S50, the endpoint determination unit 79 determines, for each unit period, whether the representative value of thickness has reached the target thickness value. When the determination result is "NO", the process proceeds to Step S40. When the determination result is "YES", the process proceeds to Step S60.

In Step S60, the etching control function 50 stops the etchant supply unit 30. Thereby the etching is ended. In Step S70, the wafer 10 is unloaded from the semiconductor manufacturing equipment. Therefore, the process on the wafer 10 is ended.

Figure 3:
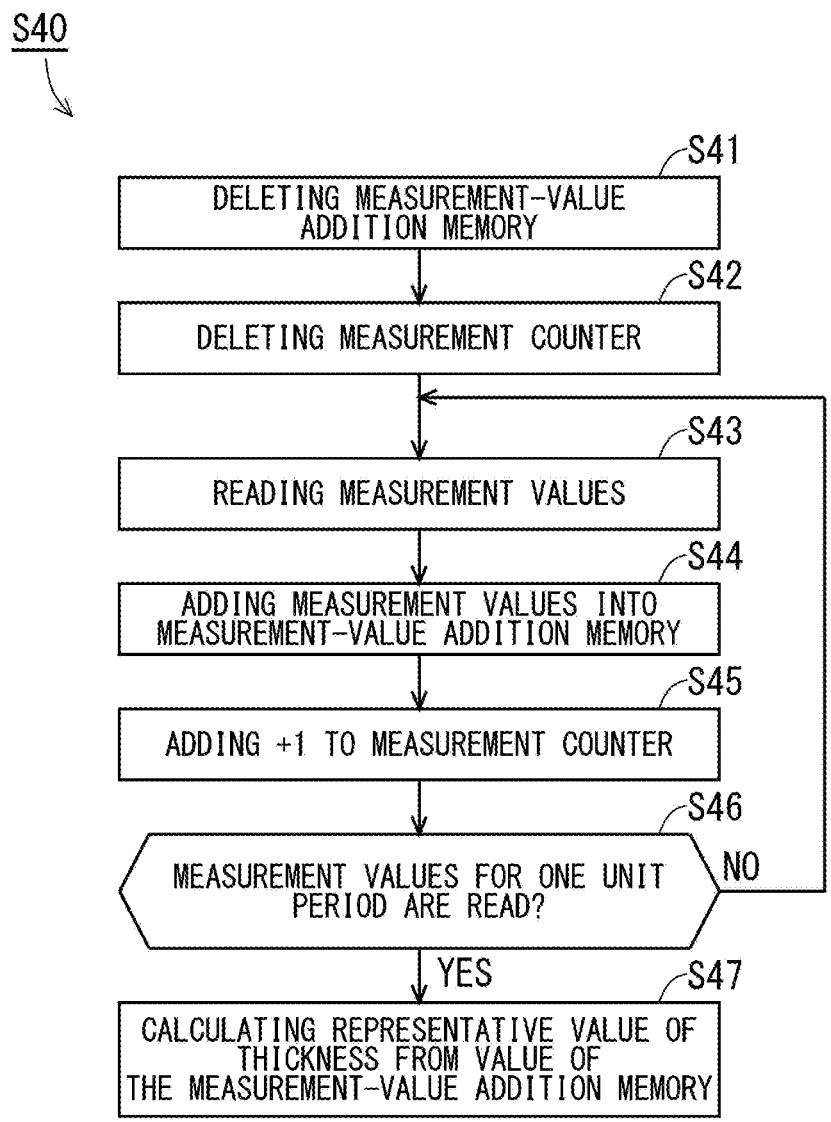
FIG. 3 A flowchart illustrating steps for calculating a representative value of thickness in the flow of FIG. 2 in detail.

Referring to FIG. 3, Step S40 (FIG. 2) is described below in detail.

In Step S41, a value of a measurement-value addition memory 60a (FIG. 1) in the thickness calculation function 60 is erased. The measurement-value addition memory 60a stores accepted values while accumulates thereof. In Step S42, a value of a measurement counter 60m (FIG. 1) in the thickness calculation function 60 is erased. The measurement counter 60m includes a memory for counting the number of read measurement values (the number of measurement points). In Step S43, the time-dependent thickness data generated by the thickness measurement function 40 is read into the thickness calculation function 60 as measurement values. In Step S44, the read measurement values are added into the measurement-value addition memory 60a. In Step S45, +1 is added to the measurement counter. In Step S46, it is determined that whether the measurement values for one unit period have been read. This determination may be based on, for example, a lapse of time corresponding to the unit period. Also, the determination may be performed by the thickness calculation function 60 to accept the above trigger signal. In this case, N cycles of the trigger signal correspond to one of the unit periods. In Step S47, the representative value of thickness is calculated from the value of the measurement-value addition memory 60a. Specifically, the representative value of thickness is calculated by dividing the value of the measurement-value addition memory 60a by the value of the measurement counter 60m. Thereby, Step S40 is ended.

(Embodiment of Semiconductor Manufacturing Method)

Figure 4:
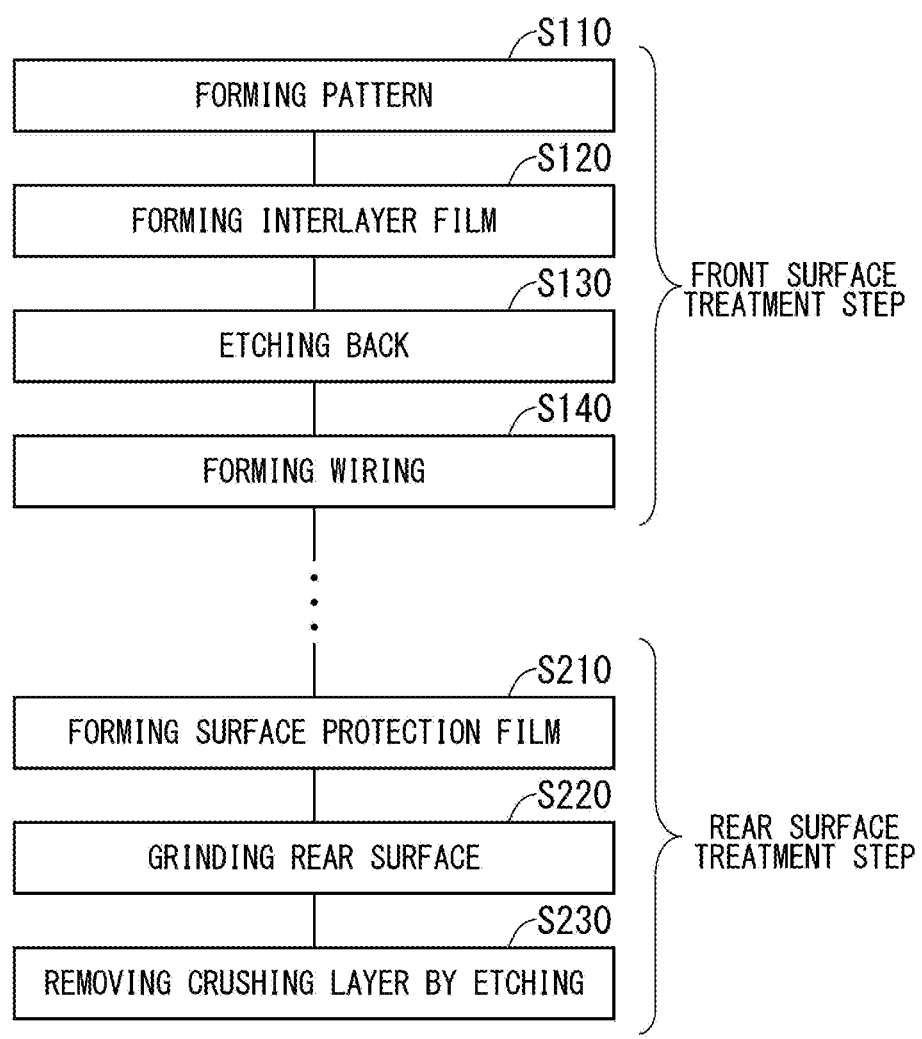
FIG. 4 A flowchart illustrating a specific example of the semiconductor manufacturing method according to Embodiment 1 of the present invention.

FIG. 4 is a manufacturing flowchart simply illustrating a part of a manufacturing method of the semiconductor product, which uses an Si wafer as a substrate of the wafer 10. Specifically, a front-surface treatment step and a rear-surface treatment step are illustrated in the manufacturing flow as an example of a step for etching the etched region. FIGS. 5 and 6 are sectional views schematically illustrating the front-surface treatment step and the rear-surface treatment step, respectively. In the front-surface treatment step, a pattern 2 such as a transistor, a diode, a capacitor, and the like is formed on the Si wafer 1 in Step S110. In Step S120, an interlayer film 3 is formed on the Si wafer 1 on which the pattern 2 has been formed. In Step S130, the interlayer film 3 is partially etched; thereby, etch back is performed for planarizing the interlayer film 3. In Step S140, a wiring (not illustrated) is formed on the planarized interlayer film 3 in Step S140. In the rear-surface treatment step, a surface protection film (not illustrated) for protecting the above wiring is formed in Step S210. In Step S220, the rear surface of the Si wafer 1 is ground to make the Si wafer 1 thin for saving power for the semiconductor product. At this time, a crushing layer 1d of the Si wafer 1 remains on the ground surface. In Step S230, the crushing layer 1d is removed by etching.

The etching method described in FIG. 2 can be employed as the above etch back (Step S130). In that case, the etched region represents a surface region of the interlayer film 3 as the structural layer provided on the Si wafer 1. The etching method described in FIG. 2 can be employed as removal of the crushing layer 1d by etching (Step S230). In that case, the etched region represents the crushing layer 1d being a part of the Si wafer 1.

(Embodiment of Endpoint Detection)

Figure 7:
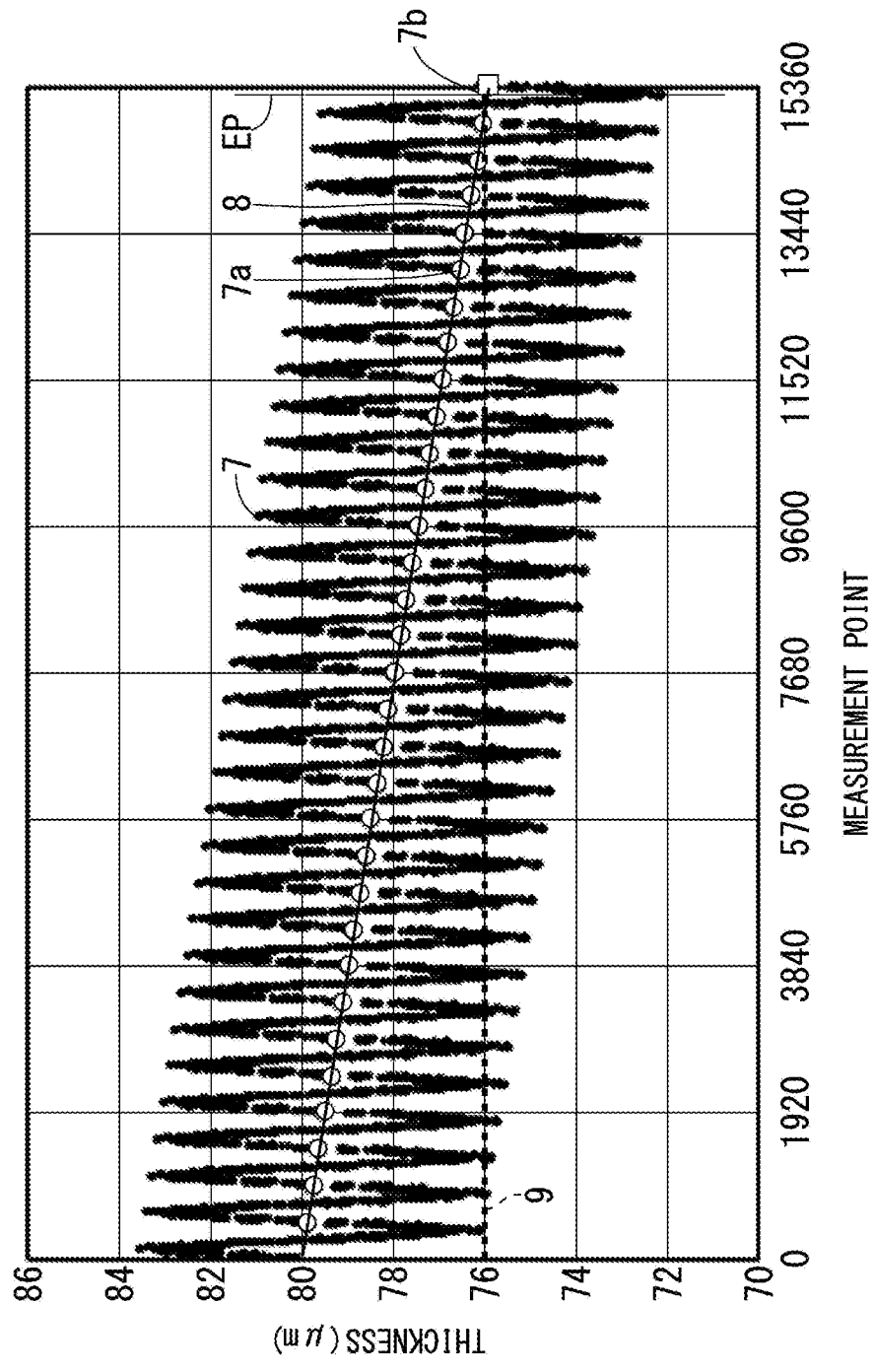
FIG. 7 A graph illustrating an example of an endpoint detection technique in a semiconductor manufacturing method of FIG. 2.

FIG. 7 is a graph illustrating an example of an endpoint detection technique in the semiconductor manufacturing method of FIG. 2. In the present example, N=1. That is, the thickness calculation function 60 calculates the representative value 7a (white circles in the graph) for the thickness of the etched region for each unit period in which the wafer 10 makes one rotation, based on measurement values of a measurement section.

According to the method, the reading of the measurement values 7 for each unit period is synchronized with the rotation, and the calculation of the representative value 7a of thickness based on their average is also synchronized with the rotation. Supposing that, the measurement values are not synchronized with the rotation and the measurement values for, for example, each 1.5 rotations are used, the measurement values for the 0.5 rotation would be the measurement values obtained by doubly measuring the same region on the wafer 10. For this reason, the difference in weighting for measurement would be double between one of the semicircular regions and the other one of the semicircular regions of the wafer 10. This leads to the fluctuations in the representative value of thickness. Whereas in the present example, in individual measurements, weighting values in the measurement area on the wafer 10 are the same. For this reason, the representative value 7a of thickness indicates an average thickness of the wafer for one rotation at the endpoint detection position 40a. Thus, for example, when the average thickness of the Si surface is defined as "thickness value", transition of representative value 7a of thickness can be equalized with by transition 8 (an oblique line in the graph) of the actual thickness value by appropriately adjusting the endpoint detection position 40a. Therefore, the endpoint-detection target-thickness value 7b (76 μm in the present example) indicates that the finish target thickness 9 has been reached. By stopping the etching with the time point as the target endpoint EP, the difference between the finish target thickness 9 and the actual finished thickness is less likely to occur.

(Comparative Example of Endpoint Detection)

Figure 8:
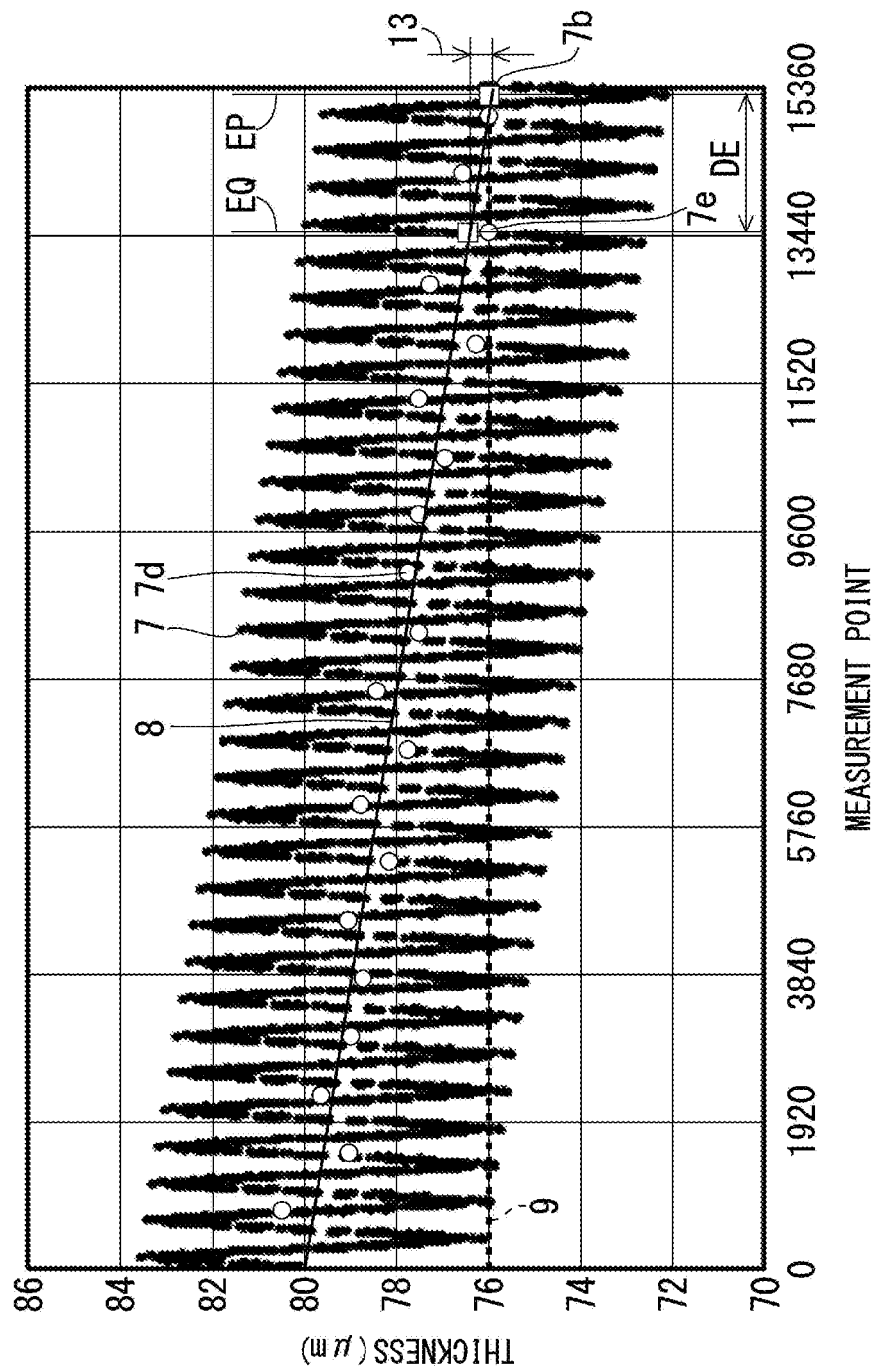
FIG. 8 A graph illustrating an endpoint detection technique of a comparative example.

FIG. 8 is a graph illustrating an endpoint detection technique of a comparative example. The comparative example is different from the above Embodiments in that the reading of the measurement values 7 for each unit period is not synchronized with the rotation, and the calculation of the representative value 7d of thickness based on their average is not synchronized with the rotation, either. Therefore, in the comparative example, the endpoint detection is performed with the representative thickness value 7d which is not synchronized with the rotation, and, using the endpoint detection thickness value 7e corresponding thereto, whether the finish target thickness 9 has been reached is detected, and the etching is ended at the endpoint EQ being this detected point. The endpoint EQ is, with the difference DE, before the target end point EP based on an endpoint-detection target-thickness value 7b that is on extension of actual thickness value transition 8; therefore, the difference 13 between the finish target thickness and the finished thickness occurs. Needless to mention that, on the contrary to the example of FIG. 8, the difference between the finish target thickness and the finished thickness can occur when the etching is stopped at the endpoint after the target end point EP. Accordingly, the difference between the finish target thickness and the finished thickness tends to occur with the endpoint detection technique of the comparative example. This occurs because the representative value 7d of thickness fluctuates with respect to the transition 8 of the actual thickness value due to not being synchronized with the rotation.

Whereas according to the above Embodiment (FIG. 7), the representative value 7a of thickness is less likely to fluctuate with respect to the transition 8 of the actual thickness value due to being synchronized with the rotation. That is, the transition of the representative value 7a of thickness for each unit period correctly reflects the transition of etching progressed with elapse of the unit period.

(Summary of Effect)

According to Embodiment 1, the representative value of thickness is calculated for each unit period based on the measurement values of the measurement section.

Therefore, the thickness of each position on the wafer 10 about the rotational axis AX uniformly reflects more than in the case where such consideration as above on the rotation of the wafer 10 is lacked. In other words, weighting values measured about the rotational axis AX are equalized. Therefore, etching progress for each unit period can be detected in high precision. Thus, the difference between the finished thickness value and the target thickness value in the etching step can be subsided.

Embodiment 2

Figure 9:
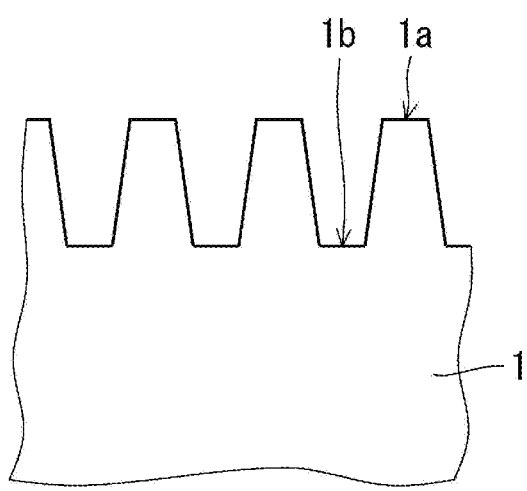
FIG. 9 A local sectional view schematically illustrating a near-surface of a semiconductor wafer according to Embodiment 2 of the present invention.

FIG. 9 is a local sectional view schematically illustrating a near-surface of a Si wafer 1 as an etched region according to Embodiment 2. In Embodiment 2, the Si wafer 1 includes an Si surface 1a and a trench portion (level difference) 1b. In Embodiment 2, the crushing layer 1d (FIG. 6) positioned on the opposite side to the surface on which a trench pattern is provided as illustrated in FIG. 9, is subject to etching.

FIG. 10 is a graph illustrating the calculation of the representative value of thickness for the endpoint detection technique according to Embodiment 2. Of measurement values 7, measurement values 7c circled with dashed line are measurement values indicating the trench portion 1b (FIG. 9). By setting the average thickness value in the measurement section (in the graph, the measurement section included in the width of "one rotation" on the horizontal axis) for each rotation to the representative value 7a of thickness, the individual weightings of the measurement values obtained in each measurement section become the same each time. For this reason, the representative value 7a of thickness indicates an average thickness of the wafer for one rotation at the endpoint detection position 40a (FIG. 1). However, the measurement values 7 include not only the measurement values indicating the thickness of the Si surface 1a but also the measurement values 7c indicating the thickness of the trench portion 1b; therefore, when the average thickness of the Si surface is defined as the thickness value, the difference between the transition of the representative value 7a of thickness for each measurement section and the transition 8 of thickness value is generated. In Embodiment 2, this difference is treated as an offset value DF and the transition of the representative value of thickness for each measurement section is considered as a value in which the offset value DF is added to the representative value 7a of thickness of above described Embodiment 1. Thus, if any means for grasping the offset value DF is provided, the difference between the finished thickness value and the target thickness value under the influence of the trench portion 1b can be subsided.

The configuration other than the above is substantially the same as that of the above-described Embodiment 1, therefore, the same or corresponding elements are denoted by the same reference numerals, and description thereof will not be repeated.

Embodiment 3

Summary

In above Embodiments 1 and 2, the representative value of thickness is calculated by using the average thickness of the measurement values 7 of the wafer for one rotation. Meanwhile, in the case where the measurements values are divided into a plurality of groups, a more appropriate value can be calculated as the representative value of thickness by employing a method different from this method. In this Embodiment 3, such a method will be described. Generally speaking, in the method of calculating the representative value of thickness in Embodiment 3, from which of a plurality of groups the representative value is to be calculated is determined, measurement values considered to indicate the thickness in the group are selected, and the representative value is calculated from those values.

As a method of extracting a group, there is a method in which histogram data is generated from a plurality of the measurement values, and a class having a frequency equal to or greater than a predetermined frequency is treated as a class indicating the thickness and a class group in which such classes are continuous is extracted as a group. The noise of the measurement values can be reduced by preventing classes having the frequency less than the predetermined frequency from being involved. Meanwhile, for the determination method of the predetermined frequency, description is not be made here as there are many methods therefor, such as using a fixed value, using a predetermined rate of the maximum frequency, using a predetermined rate for all cumulative frequency, and so forth. The method is chosen so as to be suited to the histogram data to be generated.

For example, when the measurement values indicating the thickness of the Si surface 1a as illustrated in FIG. 9 and the measurement values indicating the thickness of the trench portion 1b are clearly separated each other as groups, a predetermined frequency can be determined so that the class group indicating the thickness of the Si surface 1a and the class group indicating the thickness of the trench portion 1b are treated separately, that is, two class groups are present. The class group including the largest class indicates the thickness from the Si wafer surface 1a and the class group including the smallest class indicates the thickness from the trench portion 1b.

Calculation of the representative value that reflects the transition of etching may be based on a class included in either of the class groups. However, it can be understood that if each shape of the trench portion 1b differs depending on locations on the wafer due to low in-plane uniformity during the trench formation, the class group indicating the thickness of the trench portion 1b broadens, leading to a large error. Therefore, it is considered that accuracy of the endpoint detection improves by basing on the class included in the class group indicating the thickness of the Si surface 1a, in which the error is small.

In the case where the class group including the largest class and the class group including the smallest class are clearly separated, it is considered that almost no interference occurs between the class groups. Therefore, as the method for calculating the representative value, a frequency-distribution-average value calculated by using a median of all classes in the class group including the largest class can be set to the representative value of thickness. When the class groups are clearly separated and the frequency is close to the normal distribution, an average value of the median of the largest class and the median of the smallest class in the class group including the largest class can be set to the representative value of thickness. Also, when there is slight interference between the class group including the largest class and the class group including the smallest class, the median of the class having the largest frequency in the class group including the largest value can be set to the representative value of thickness, or a median of the class at the boundary where the frequencies change from increase to decrease from a larger class side in the class group including the largest class can be set to the representative value of thickness. Therefore, the influence of the class in the range that is considered to have interference in the class group can be suppressed. Further, when there is considerable interference between the class group including the largest class and the class group including the smallest class, a frequency-distribution-average value calculated by using the median of each class in the predetermined range from the largest class to the smaller class in the class group including the largest class can be set to the representative value of thickness.

Therefore, the influence of the class in the range that is considered to have broad interference in the class group can be suppressed.

It should be noted that, the above method for calculation of the respective representative values can be applied even in the case where there is a considerable trail between the class group including the largest class and the class group including the smallest class and the class groups are not separated, for certain. Needless to mention that, specifically, the above method, each of the representative values can be calculated from the largest class on apparently one class group consisted of these class groups.

Meanwhile, depending on the state of the wafer or the position of measurement, for example, it can be considered that either of measurement values indicating the thickness of the Si surface $1a$ or measurement values indicating the thickness of the trench portion $1b$, as illustrated in FIG. 9, may be dominant. Even in such a case, by calculating the representative value of thickness based on the measurement values of the measurement section for each unit period synchronized with the rotation, the weighting of each measurement value obtained for each measurement section becomes the same. That is, the transition of the representative value of thickness for each unit period correctly reflects the transition of etching that has progressed with elapse of the unit period. Therefore, the transition of the representative value of thickness for each unit period can be considered the one in which the offset value is added to the transition of the thickness value. Therefore, the influence due to the state of the wafer or the position of the measurement can be minimized by providing means for grasping the offset value.

Similarly, even when there is considerable interference between the class group including the largest class and the class group including the smallest class, by calculating the representative value of thickness based on the measurement values of the measurement section for each unit period synchronized with the rotation, the individual weightings of the measurement values obtained for each measurement section become the same. That is, the transition of the representative value of thickness for each unit period correctly reflects the transition of etching that has progressed with elapse of the unit period. Therefore, the transition of the representative value of thickness for each unit period can be considered the one in which the offset value is added to the transition of the thickness value. Therefore, the influence of the interference can be minimized by providing means for grasping the offset value.

For example, a means in which a thickness value indicating the thickness of the Si surface $1a$ is calculated from a plurality of measurement values measured along the surface layer of the wafer before etching, and a difference, between the thickness value and the representative value calculated based on measurement values of thickness of the measurement section synchronized with the rotation immediately before the start of etching, is set to the offset value can be employed as a means for grasping the offset value. In this case, for example, the thickness measurement function 40 drives the scanning mechanism 42 to scan the sensor 41 in accordance with an instruction of the etching control function 50, and the thickness calculation function 60 reads the time-dependent thickness data as measurement values, calculates the thickness value indicating the thickness of the Si surface $1a$, and transmits thereof to the etching control function 50. Next, according to the instruction by the etching control function 50, the thickness measurement function 40 drives the scanning mechanism 42 to position the sensor 41 at the end point detection position 40a, and the etching control function 50 calculates the difference between the thickness value indicating the thickness of the Si surface $1a$ transmitted from the thickness calculation function 60 and the representative value calculated based on the thickness measurement values of the measurement section synchronized with the rotation immediately before the start of etching as the offset value, and starts etching. Thereafter, the endpoint determination unit 79 determines whether the representative value of thickness has reached the target thickness value by using the value obtained by adding the offset value to the representative value of thickness transmitted from the thickness calculation function 60 as the representative value of thickness.

(Summary of Semiconductor Manufacturing Equipment and Usage the Same)

Referring to FIG. 11, the semiconductor manufacturing equipment in Embodiment 3 has a thickness calculation function 60C instead of the thickness calculation function 60 (FIG. 1). The thickness calculation function 60C includes a histogram-data creation unit 61, a class extraction unit 62, a largest-class-group extraction unit 63, and a representative-value calculation unit 64. The histogram-data creation unit 61 creates a frequency distribution of histogram data representing the frequency possessed by each of a plurality of classes by using some pieces of the time-dependent thickness data measured during a unit period. The histogram-data creation unit 61 includes a frequency counter 61m in addition to the measurement counter 60m similar to that of Embodiment 1 (FIG. 1). The frequency counter 61m includes a memory for counting the frequency of each of plurality of classes. The class extraction unit 62 extracts an extraction class which is a class having a frequency equal to or higher than a predetermined frequency among the plurality of classes. The largest-class-group extraction unit 63 extracts the largest-class group which is a group of successively existing classes from the largest class of the extraction class among the extraction classes. The representative-value calculation unit 64 calculates a representative value of thickness based on the class included in the largest-class group. With the above configuration, the thickness calculation function 60 includes a function of creating histogram data from a plurality of thickness measurement values, and calculating a representative value of thickness from the largest class side among the classes having a predetermined frequency or more.

Figure 12:
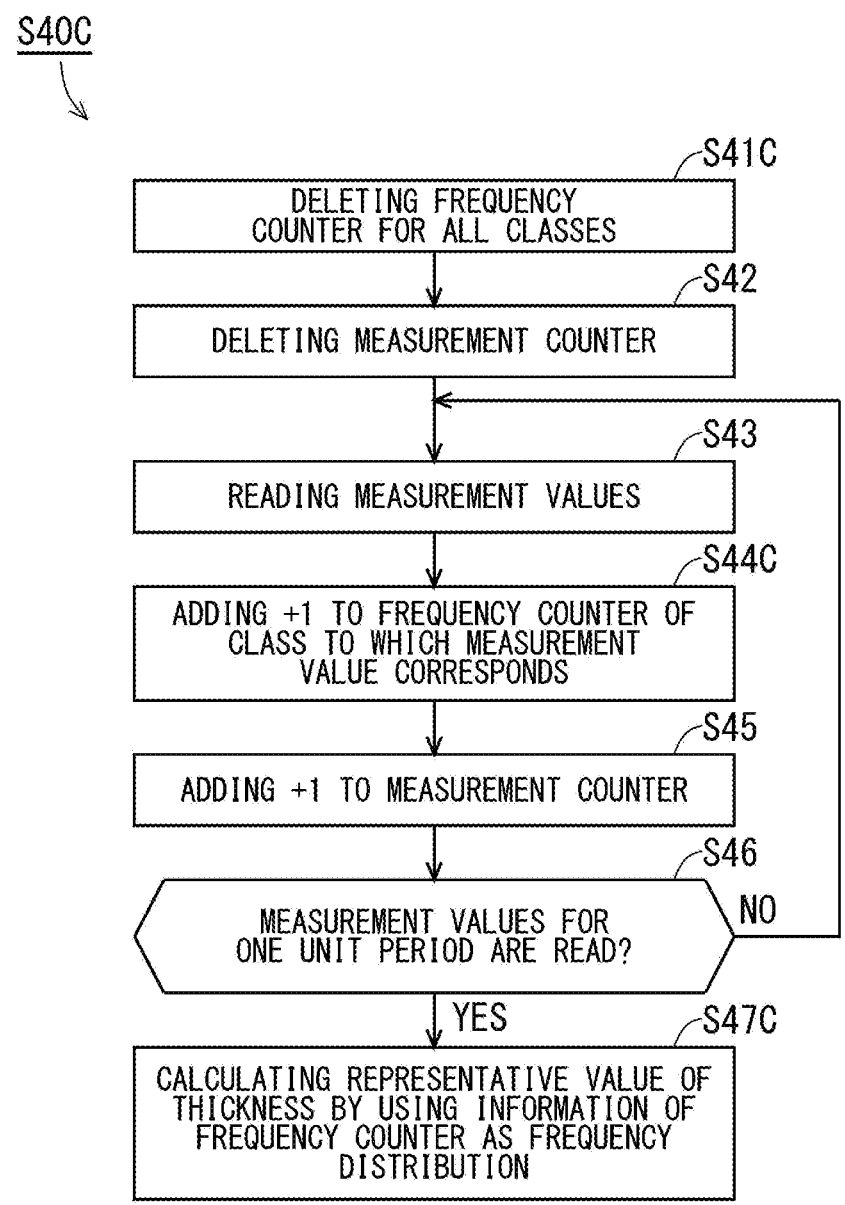
FIG. 12 A flowchart illustrating steps for calculating a representative value of thickness in the semiconductor manufacturing method according to Embodiment 3 of the present invention.

Referring to FIG. 12, in the semiconductor manufacturing method of Embodiment 3, Step S40 (FIG. 3) in the flow (FIG. 2) of Embodiment 1 is replaced with Step S40C. The details of Step S40C will be described below.

In Step S41C, the values of the frequency counter 61m (FIG. 11) are erased for all classes. In Step S42, the values of measurement counter 60m (FIG. 11) are erased. In Step S43, the time-dependent thickness data generated by the thickness measurement function 40 (FIG. 1) is read into the thickness calculation function 60C (FIG. 11) as a measurement value. In Step S44C, it is determined which of the plurality of classes in the frequency counter 61m (FIG. 11) the read measurement value corresponds to, and +1 is added to the frequency of the corresponding class. In Step S45, 1 is added to the measurement counter. In Step S46, it is determined that whether the measurement values for one unit period have been read in the same method as in Embodiment 1.

In step S47C, the representative value of thickness is calculated by using the information of the frequency counter 61m as the frequency distribution of the histogram data. Specifically, first, the class extraction unit 62 extracts an "extraction class" which is a class having a frequency equal to or higher than a predetermined frequency among the plurality of classes. Next, the largest-class-group extraction unit 63 extracts the "largest-class group" which is a group of successively existing classes from the largest class of the extraction class among the extraction classes. Next, the representative-value calculation unit 64 calculates a representative value of thickness based on the class included in the largest-class group.

Thereby, Step S40C is ended. Details of above Step S47C will be described in Working Examples A to C described later.

(Summary of Effects)

According to Embodiment 3, when the measurement values are divided into a plurality of groups, the representative value of thickness is calculated based on the group including the largest class among the plurality of groups. Therefore, the representative value of thickness can be calculated more appropriately than when the representative value of thickness is calculated from the time-dependent thickness data without distinguishing these groups. Thus, the difference between the finished thickness value and the target thickness value in the etching step can be subsided even more.

In particular, when the thickness measurement in the etched region is affected by the surface having a level difference (see FIG. 9), if the representative value of the thickness is calculated without distinguishing the above-mentioned groups, the in-plane uniformity of the level difference greatly affects the representative value of thickness. According to Embodiment 3, such influence is suppressed. Thus, the difference between the finished thickness value and the target thickness value in the etching step can be subsided even more.

(Working Examples A to E)

Working examples A to E are examples in the case where the crushing layer 1*d* on the rear surface as illustrated in FIG. 6 is etched in the Si wafer 1 having the Si surface 1*a* and the trench portion 1*b* as illustrated in FIG. 9. In these examples, in order to simplify the description, the number of measurement values for one rotation (that is, the number of measurement values per unit period) is set to 480 without fluctuation. Therefore, histogram data is created for each measurement section, with 480 measurement values as one measurement section. Hereinafter, each Working Example will be described.

Figure 15:
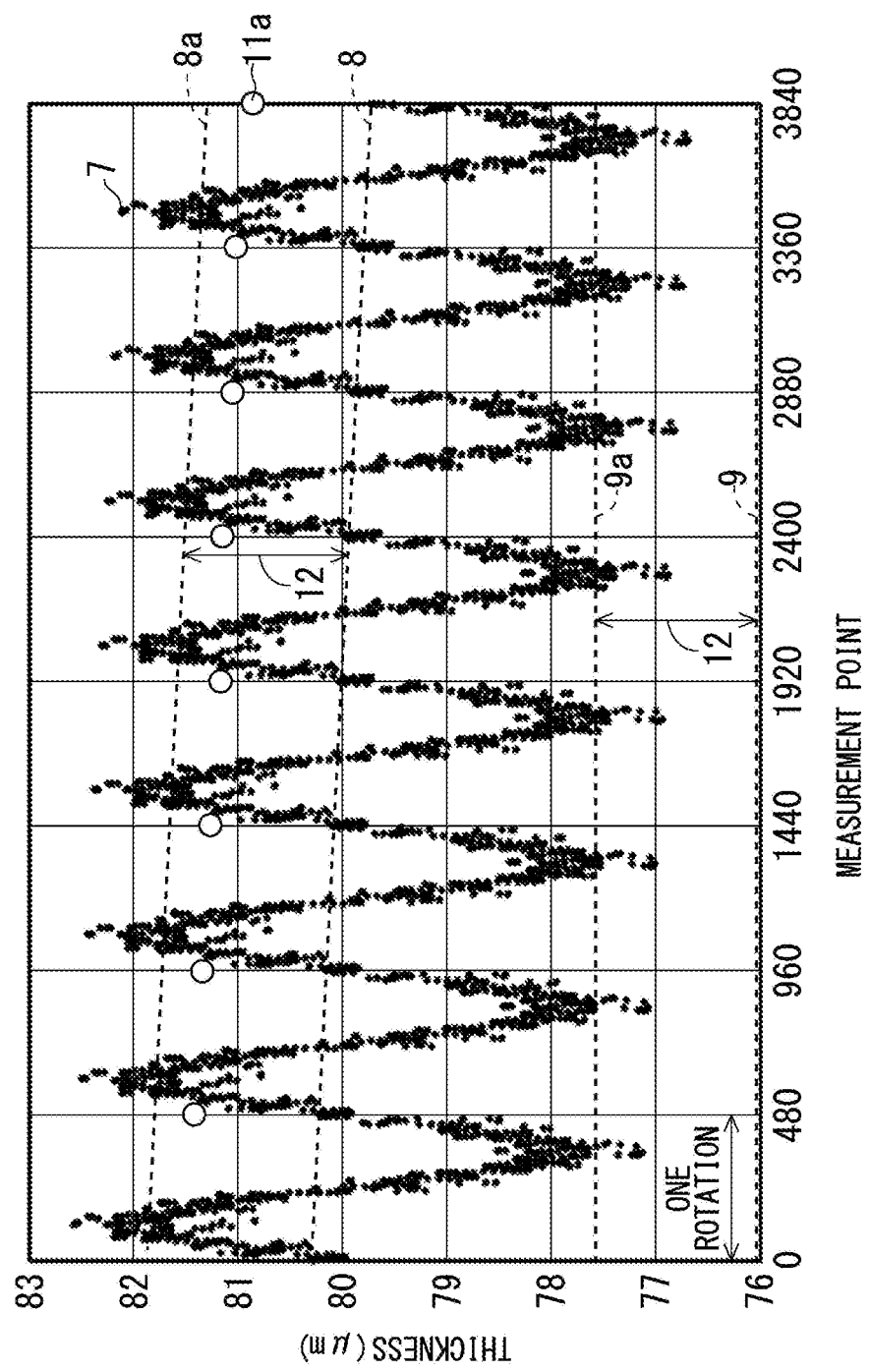
FIG. 15 A graph illustrating measurement values and the representative values for the thickness in Working Example A according to Embodiment 3 of the present invention.

FIGS. 13 and 14 are a table illustrating a method for calculating the representative value of thickness from a frequency distribution in Working Example A. In the graph, "CLASS" is represented by the upper limit value of the class, and the width of each class is 0.1 μm. Thus, for example, the class represented by "81.3" has a range from 81.2 to 81.3, and the median thereof is 81.25. Also, a class having a frequency of 5 or more is regarded as an extraction class (cells with shading in the table). The largest class among the extraction classes (the top cell with shading in the table) corresponds to the largest class. A group of successively existing classes from this largest class corresponds to the largest-class group. For example, in the unit period "1", the class group from the class "82.1" to the class "80.5" corresponds to the largest-class group. Note that, the same applies to FIGS. 16, 17, 19, 20, 22, 23, 25 and 26 described later. FIG. 15 is a graph illustrating measurement values 7 and the representative values 11*a* in Working Example A. It should be noted that, in FIG. 15, not only the transition 8 of thickness value and the finish target thickness 9 (see FIG. 7), transition 8*a* of thickness value with an offset value 12 and finish target thickness 9*a* with the offset value 12 are also illustrated. Note that, the same applies to FIGS. 18, 21, 24 and 27 described later.

In Working Example A, for the largest-class group, the representative-value calculation unit 64 sets the frequency-distribution-average value which is a value obtained by dividing the sum of the values obtained by multiplying the median of each class by the frequency of this class by the sum of the frequencies included in the class group, to the representative value of thickness. In the case where the class group including the largest class and the class group including the smallest class are clearly separated, it is considered that almost no interference occurs between the class groups. Therefore, as the method for calculating the representative value, a frequency-distribution-average value calculated by using a median of all classes in the class group including the largest class can be set to the representative value for thickness. In the unit period "1" in FIG. 13, that is, in the first measurement section (measurement point "1" to "480"), the frequency-distribution-average value calculated using the medians of all the classes of the class group (82.1 to 80.5) including the largest class (82.1) among the extraction classes, the distribution average value is (82.05×17+81.95× 6+ . . . +80.45×7)/192=81.25. Therefore, the representative value in this example changes from 81.25 to 81.25 to 81.15 to 81.15 to 81.05 to 80.95 to 80.95 to 80.85 as the unit period progresses from "1" toward "8".

Figure 18:
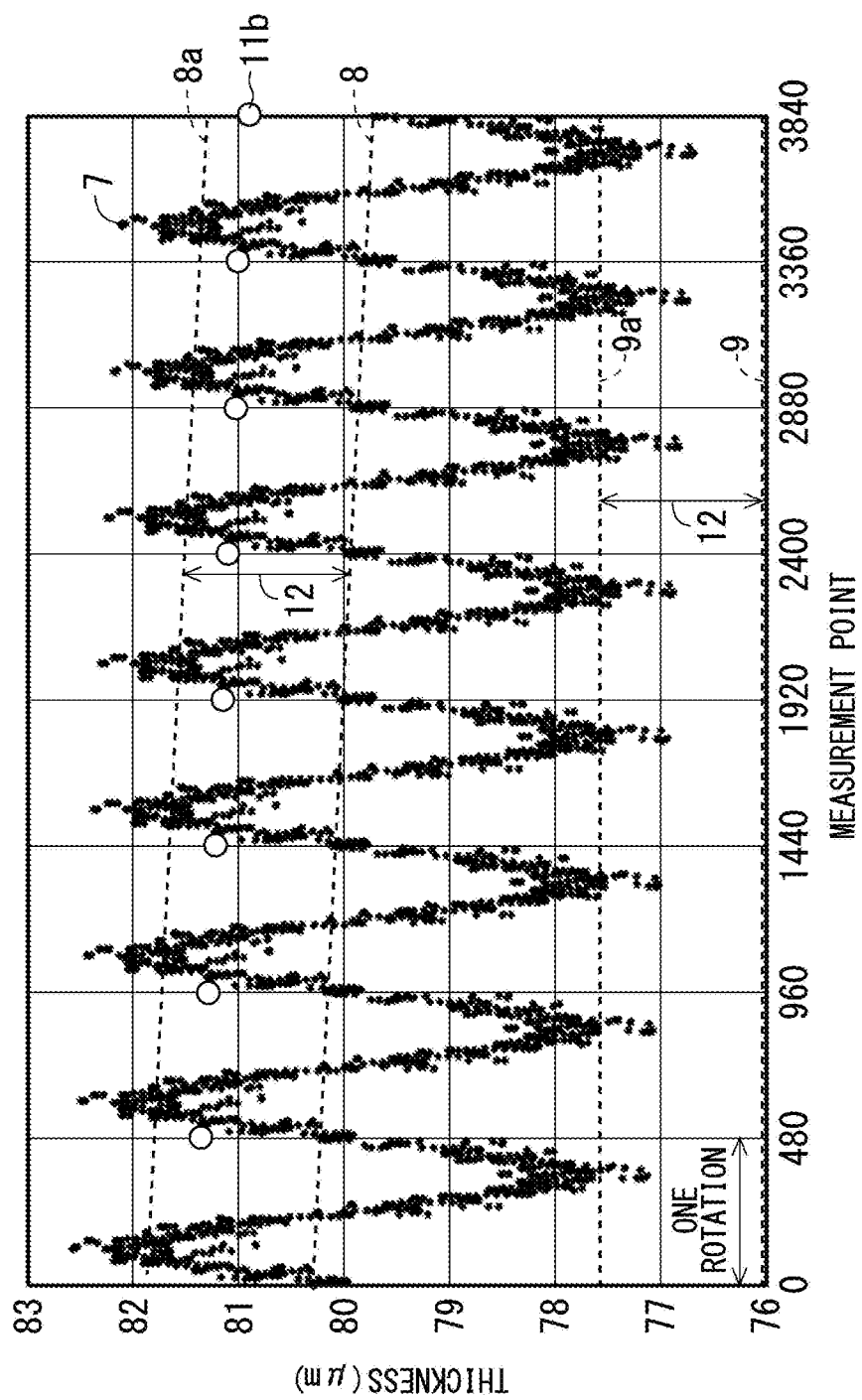
FIG. 18 A graph illustrating measurement values and the representative values for the thickness in Working Example B according to Embodiment 3 of the present invention.

FIGS. 16 and 17 are a table illustrating a method for calculating the representative value of thickness from a frequency distribution of histogram data in Working Example B. FIG. 18 is a graph illustrating measurement values 7 and the representative values 11*b* in Working Example B. In Working Example B, the representative-value calculation unit 64 sets the average value of the median of the largest class and the median of the smallest class among the largest-class group to the representative value of thickness. This method is particularly suitable when the class groups are clearly separated and the frequency distribution is close to the normal distribution. In the unit period "1" in FIG. 16, that is, in the first measurement section (measurement point "1" to "480"), in the class group (82.1 to 80.5) including the largest class (82.1) among the extraction classes, the average value of the median 82.05 of the largest class (82.1) and the median 80.45 of the smallest class (80.5) is 81.25. Therefore, the representative value in this example changes from 81.25 to 81.25 to 81.15 to 81.05 to 81.05 to 80.95 to 80.95 to 80.85 as the unit period progresses from "1" toward "8".

Figure 21:
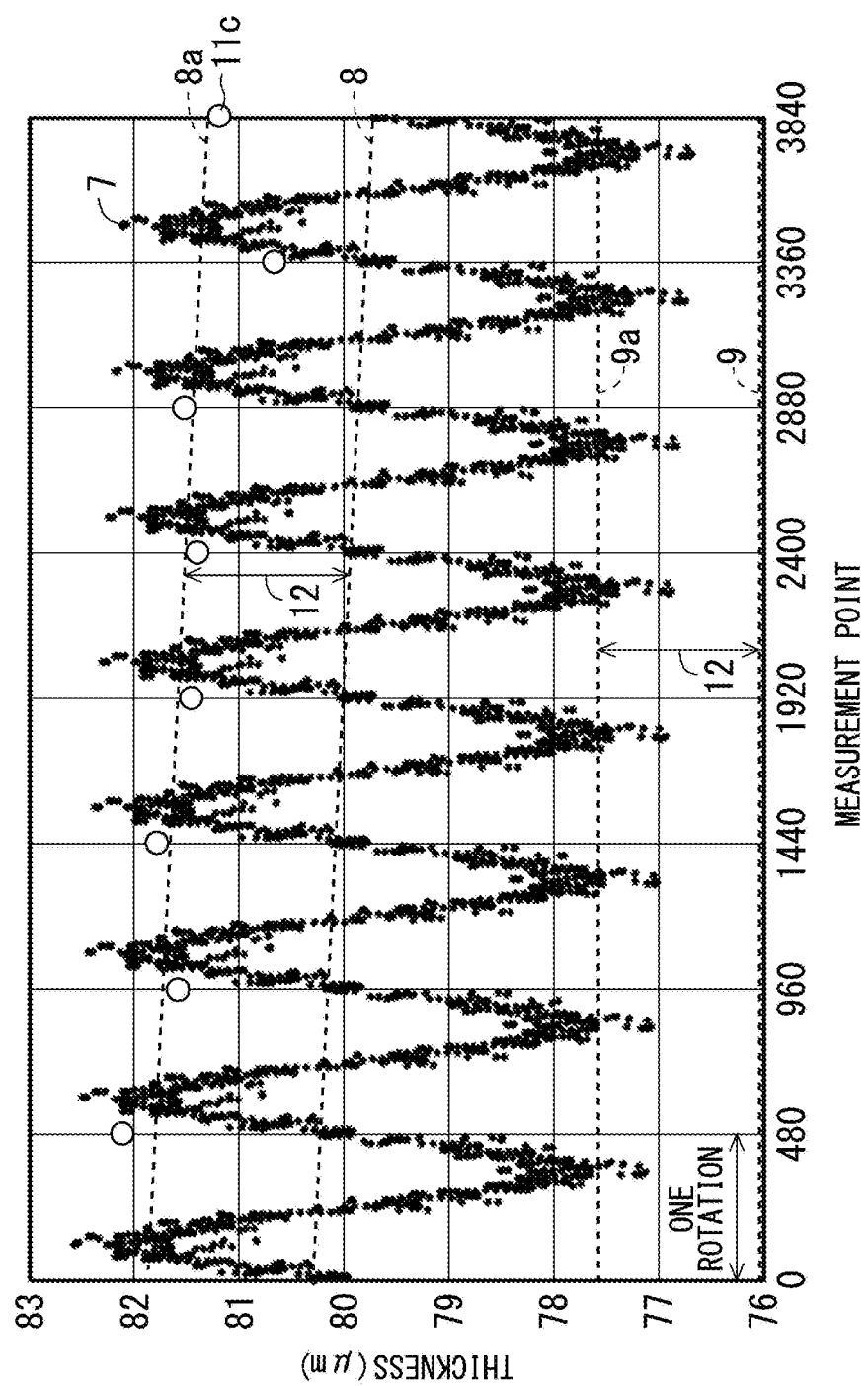
FIG. 21 A graph illustrating measurement values and the representative values for the thickness in Working Example C according to Embodiment 3 of the present invention.

FIGS. 19 and 20 are a table illustrating a method for calculating the representative value of thickness from a frequency distribution of histogram data in Working Example C. FIG. 21 is a graph illustrating measurement values 7 and the representative values 11*c* in Working Example C. In Working Example C, the representative-value calculation unit 64 sets the median of the class having the largest frequency among the largest-class group to the representative value of thickness. This method is particularly suitable when there is slight interference between the class group including the largest class and the class group including the smallest class; the influence of the class in the range that is considered to have interference in the class group can be suppressed. In the unit period "1" in FIG. 19, that is, in the first measurement section (measurement point "1" to "480"), in the class group (82.1 to 80.5) including the largest class (82.1) among the extraction classes, the median of the class having the largest frequency is 82.05. Therefore, the representative value in this example changes from 82.05 to 81.55 to 81.65 to 81.45 to 81.35 to 81.45 to 80.65 to 81.15 as the unit period progresses from "1" toward "8".

Figure 24:
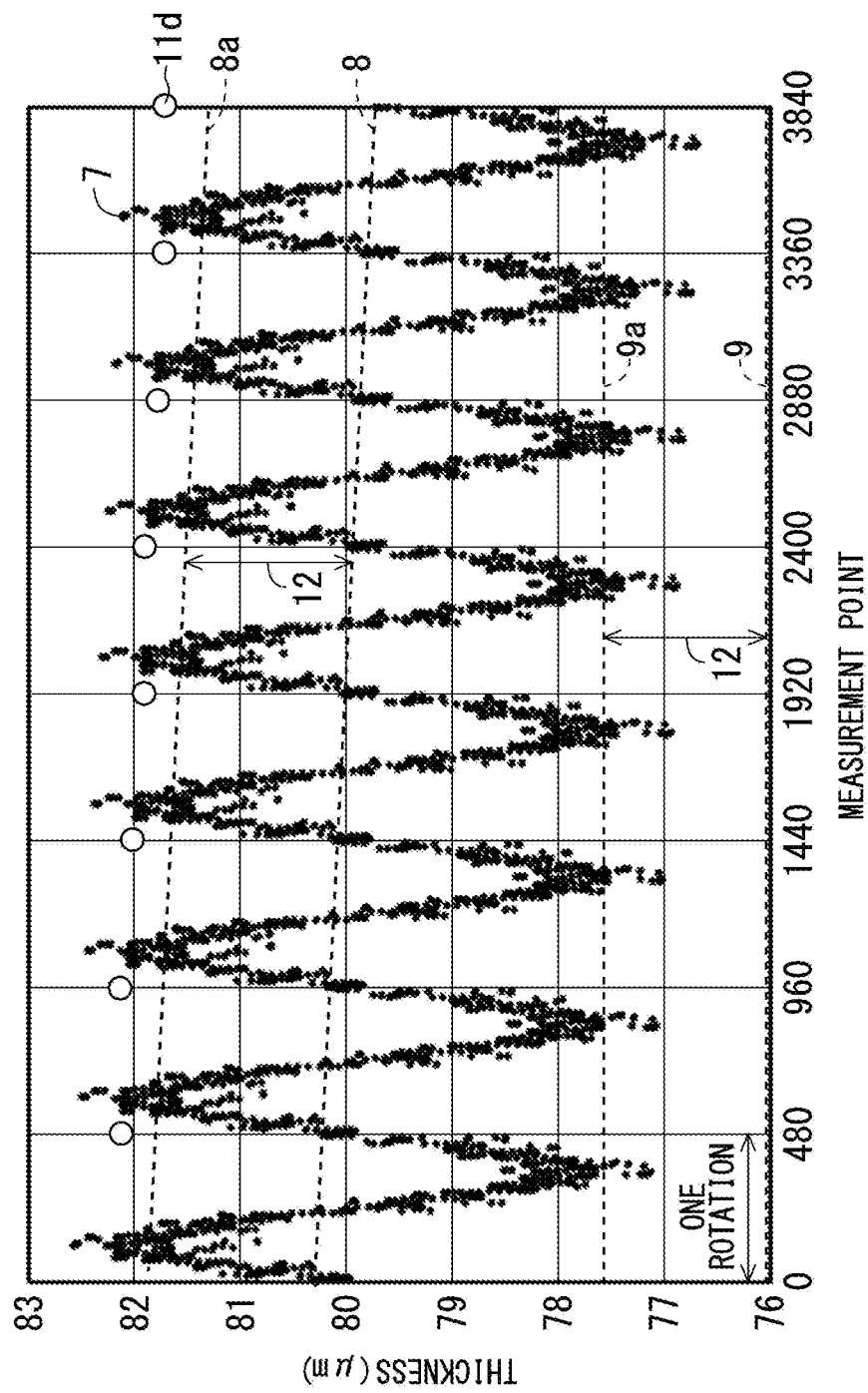
FIG. 24 A graph illustrating measurement values and the representative values for the thickness in Working Example D according to Embodiment 3 of the present invention.

FIGS. 22 and 23 are a table illustrating a method for calculating the representative value of thickness from a frequency distribution of histogram data in Working Example D. FIG. 24 is a graph illustrating measurement values 7 and the representative values 11*d* in Working Example D. In Working Example D, the representative-value calculation unit 64 sets the median of the class at the boundary where the frequencies change from increase to decrease from the largest class side to the representative value of thickness. Therefore, the influence of the class that is considered to have interference in the class group can be suppressed. In the unit period "1" in FIG. 19, that is, in the first measurement section (measurement point "1" to "480"), in the class group (82.1 to 80.5) including the largest class (82.1) among the extraction classes, the median of the class (82.1) at the boundary where the frequencies change from increase to decrease from the larger class side is 82.05. Therefore, the representative value in this example changes from 82.05 to 82.05 to 81.95 to 81.85 to 81.85 to 81.75 to 81.65 to 81.65 as the unit period progresses from "1" toward "8".

FIGS. 25 and 26 are a table illustrating a method for calculating the representative value of thickness from a frequency distribution of histogram data in Working Example E. FIG. 27 is a graph illustrating measurement values 7 and the representative values 11*e* in Working Example E. In Working Example E, the representative-value calculation unit 64 sets the frequency-distribution-average value calculated in the predetermined range from the largest class toward the smaller class side, to the representative value of thickness. This method is particularly suitable when there is considerable interference between the class group including the largest class and the class group including the smallest class; the influence of the class in the range that is considered to have broad interference in the class group can be suppressed. In the unit period "1" in FIG. 25, that is, in the first measurement section (measurement point "1" to "480"), the frequency-distribution-average value calculated by using the median of each class in the predetermined range (1.0) from the largest class (82.1) to the smaller class in the class group (82.1 to 80.5) including the largest class (82.1) among the extraction classes is 81.65. Therefore, the representative value in this example changes from 81.65 to 81.55 to 81.45 to 81.45 to 81.35 to 81.35 to 81.25 to 81.15 as the unit period progresses from "1" toward "8".

The calculation method according to Working Examples A to E or other calculation method of the representative value of thickness may be appropriately employed depending on the degree of interference between the class group including the largest class and the class group including the smallest class. Depending on the difference in respective calculation methods and the difference in parameters that relates to the calculation methods, the difference to be generated between the transition of representative value of thickness and the transition 8 of thickness value may be varied for each measurement section. Therefore, it is preferable that the offset value 12 is assumed according to the calculation method to be employed, the transition of the representative value of thickness for each measurement section is set to the transition 8*a* of thickness value with the offset value 12, and it is grasped that finish target thickness 9*a* with the offset value 12 has been reached. Accordingly, the etching stops at the target endpoint, and the difference between the finish target thickness 9 and the finished thickness hardly occurs. For example, as described above, first, a thickness value indicating the thickness of the Si surface 1*a* is calculated from a plurality of measurement values measured along the surface layer of the Si wafer 1 (FIG. 9) before etching. The difference between the thickness value and the representative value calculated based on the thickness measurement values of the measurement section synchronized with the rotation immediately before the start of etching can be set to the offset value.

It should be noted that, in each Working Example, although the representative value of thickness is calculated based on the measurement values obtained for each measurement section of one rotation, if the stop accuracy of etching is acceptable, there is no problem even if the representative value of thickness is calculated based on the number of multiples obtained for each measurement section of multiple rotations. In addition, although the thickness measurement of the Si wafer in which the trench is formed is mainly described for detailed description, the present invention is not limited thereto. The thickness measurement object (i.e., the etched region) may not be the wafer itself, but may be any structural layer formed on the wafer. Also, as the material for the thickness measurement object, not only silicon (Si) but also a material containing silicon (Si), carbon (C), a material containing carbon (C), metal, a material containing metal, etc. are considered.

<Example of Hardware Configuration>

The etching control function 50 (FIG. 1) includes, for example, a Personal Computer (PC) for industrial use as a master and a Programmable Logic Controller (PLC) as a slave. The master performs inter-unit flow control, treatment management, parameter management, data management and error management or the like. The slave performs unit control or the like. The pachymeter controller 43 includes, for example, a microcomputer board. The microcomputer board configures the thickness-data generation unit 43*g*, and generates time-dependent thickness data from, for example, the intensity of interference light obtained from the sensor 41 based on the measurement control parameters that have been set. The thickness calculation function 60 or 60C includes, for example, a dedicated logic circuit or a PC for industrial use. It should be noted that, the pachymeter controller 43, the etching control function 50, and the thickness calculation function 60 or 60C are not limited to those above-described configuration. The following will be the additional description therefor by taking the thickness calculation function 60 or 60C as an example of this.

FIG. 28 is a diagram illustrating a configuration of hardware for the thickness calculation function 60 or 60C. A processing circuit HW3 writes the time-dependent thickness data transmitted from the pachymeter controller 43 of the thickness measurement function 40 into a memory HW2 via the input/output interface HW1. For example, DRAM, SRAM, FLASH, etc. correspond to the memory HW2.

Further, by using HW2, the processing circuit HW3 performs the processes of the measurement-value addition memory 60*a* and the measurement counter 60*m* in the thickness calculation function 60, and performs the processes of the histogram-data creation unit 61, the class extraction unit 62, the largest-class-group extraction unit 63, and the representative-value calculation unit 64 in the thickness calculation function 60C. The processing circuit HW3 may be a dedicated logic circuit or an arithmetic processing integrated circuit such as a Central Processing Unit (CPU) that executes a program stored in the memory HW2.

In the case where the processing circuit HW3 is a dedicated logic circuit, the processing circuit HW3 corresponds to, for example, a logic device, a programmable logic device (PLD), an ASIC, or a combination thereof.

In the case where the processing circuit HW3 is a CPU, the processes of the measurement-value addition memory 60a and the measurement counter 60m is written as programs in the thickness calculation function 60, and the processes of the histogram-data creation unit 61, the class extraction unit 62, the largest-class-group extraction unit 63, and the representative-value calculation unit 64 is written as programs in the thickness calculation function 60C, and the programs are stored in an auxiliary storage medium HW4. The processing circuit HW3 reads the programs stored in the auxiliary storage medium HW4 at the time of activation to the memory HW2 and executes thereof, thereby realizing the respective processes. Here, the auxiliary storage medium HW4 is, for example, a nonvolatile semiconductor memory such as FLASH, a magnetic disk, or the like.

Note that part of the processing may be realized by a dedicated logic circuit and part may be realized by programs.

In each of above Embodiments, the case where the etching mechanism of the semiconductor manufacturing equipment performs wet etching on the wafer has been described in detail, but the etching mechanism may perform dry etching on the wafer.

It should be noted that Embodiments of the present invention can be arbitrarily combined and can be appropriately modified or omitted without departing from the scope of the invention. While the invention has been described in detail, the foregoing description is in all aspects illustrative and not restrictive. It is understood that numerous other modifications and variations can be devised without departing from the scope of the invention.

EXPLANATION OF REFERENCE SIGNS

AX rotational axis, 1 Si wafer, 1a Si surface, 1b trench portion, 1d crushing layer, 2 pattern, 3 interlayer film, 7 measurement value, 10 wafer, 20 rotary stage (rotation mechanism), 30 etchant supply unit (etching mechanism), 30a scanning operation, 30b etchant, 31 nozzle, 32 arm, 40 thickness measurement function, 40a endpoint detection position, 41 sensor, 42 scanning mechanism, 43 pachymeter controller, 43g thickness-data generation unit, 50 etching control function, 60, 60C thickness calculation function, 60a measurement-value addition memory, 60m measurement counter, 61 histogram-data creation unit, 61m frequency counter, 62 class extraction unit, 63 largest-class-group extraction unit, 64 representative-value calculation unit, 71 target-thickness storage unit, 79 endpoint determination unit, 90 processing system of semiconductor manufacturing equipment.

The invention claimed is:

1. Semiconductor manufacturing equipment, comprising:
a rotation mechanism configured to rotate a wafer including an etched region, which is to be etched at least partially;
an etching mechanism configured to etch the etched region;
a thickness measurement function configured to generate time-dependent thickness data by measuring a thickness of the etched region;
an etching control function configured to stop the etching mechanism when a representative value of thickness of the etched region reaches a target thickness value; and
a thickness calculation function configured to calculate the representative value of thickness for each unit period in which the wafer is rotated N times, where N is a natural number, based on measurement values of the time-dependent thickness data in a measurement section being a range measured during the unit period.

2. The semiconductor manufacturing equipment according to claim 1, wherein
the thickness calculation function includes
a histogram-data creation unit configured to create histogram data representing a frequency possessed by each of a plurality of classes, by using measurement values of the measurement section among the time-dependent thickness data,
a class extraction unit configured to extract extraction classes which are classes having a frequency equal to or higher than a predetermined frequency among the plurality of classes,
a largest-class-group extraction unit configured to extract among the extraction classes a largest-class group which is a group of successively existing classes from a largest class of the extraction classes, and
a representative-value calculation unit configured to calculate the representative value based on a frequency distribution for the largest-class group.

3. The semiconductor manufacturing equipment according to claim 2, wherein
the representative-value calculation unit is configured to use a frequency-distribution-average value for the largest-class group as the representative value.

4. The semiconductor manufacturing equipment according to claim 2, wherein
the representative-value calculation unit is configured to use an average value of a median of a largest class and a median of a smallest class among the largest-class group as the representative value of thickness.

5. The semiconductor manufacturing equipment according to claim 2, wherein
the representative-value calculation unit is configured to use a median of a class possessing a largest frequency among the largest-class group as the representative value of thickness.

6. The semiconductor manufacturing equipment according to claim 2, wherein
the representative-value calculation unit is configured to use, as the representative value of thickness, a median of a class at a boundary where, from a largest class side, the frequencies change from increase to decrease.

7. The semiconductor manufacturing equipment according to claim 2, wherein
the representative-value calculation unit is configured to use a frequency-distribution-average value for a class group within a predetermined range from a largest class among the largest-class group as the representative value.

8. A semiconductor manufacturing method, comprising the steps of:
preparing semiconductor manufacturing equipment including a rotation mechanism configured to rotate a wafer including an etched region, which is to be etched at least partially, an etching mechanism configured to etch the etched region, a thickness measurement function configured to generate time-dependent thickness data by measuring a thickness of the etched region, an etching control function configured to stop the etching mechanism when a representative value of thickness of the etched region reaches a target thickness value, and a thickness calculation function configured to calculate the representative value of thickness for each unit period in which the wafer is rotated N times, where N is a natural number, based on measurement values of the time-dependent thickness data in a measurement section being a range measured during the unit period; and processing the wafer by using the semiconductor manufacturing equipment.

9. The semiconductor manufacturing method according to claim 8, wherein the thickness calculation function includes a histogram-data creation unit configured to create histogram data representing a frequency possessed by each of a plurality of classes, by using measurement values of the measurement section among the time-dependent thickness data, a class extraction unit configured to extract an extraction class which is a class having a frequency equal to or higher than a predetermined frequency among the plurality of classes, a largest-class-group extraction unit configured to extract among the extraction classes a largest-class group which is a group of successively existing classes from a largest class of the extraction classes, and a representative-value calculation unit configured to calculate the representative value based on a frequency distribution for the largest-class group.

\* \* \* \* \*